United States Patent [19]

Fujihira

[11] Patent Number: 5,422,593
[45] Date of Patent: Jun. 6, 1995

[54] CURRENT-LIMITING CIRCUIT

[75] Inventor: Tatsuhiko Fujihira, Nagano, Japan

[73] Assignee: Fuji Electric Co., Ltd., Kawasaki, Japan

[21] Appl. No.: 61,172

[22] Filed: May 12, 1993

[30] Foreign Application Priority Data

May 12, 1992 [JP] Japan ................... 4-117811

[51] Int. Cl.⁶ ............... H03F 3/45; H03G 3/00
[52] U.S. Cl. ....................... 327/561; 327/563; 327/427; 330/254
[58] Field of Search ........... 307/493, 494, 497, 571, 307/573, 296.1, 296.6; 323/315, 314, 313; 330/254

[56] References Cited

U.S. PATENT DOCUMENTS

| | | | |
|---|---|---|---|
| 4,553,084 | 11/1985 | Wrathall | 323/316 |
| 4,634,902 | 1/1987 | Tanaka et al. | 307/573 |
| 4,954,728 | 9/1990 | Pavlin | 307/296 |
| 5,013,934 | 5/1991 | Hobrecht et al. | 307/296.6 |
| 5,157,322 | 10/1992 | Llewellyn | 307/296.1 |
| 5,159,516 | 10/1992 | Fujihira | 361/18 |

FOREIGN PATENT DOCUMENTS

| | | |
|---|---|---|
| 0414434 | 2/1991 | European Pat. Off. . |
| 63-104117 | 5/1988 | Japan . |
| 3143221 | 6/1991 | Japan . |
| 4-52816 | 2/1992 | Japan . |
| 2034939 | 6/1980 | United Kingdom . |
| 2231179 | 7/1990 | United Kingdom . |

OTHER PUBLICATIONS

"Bipolar and MOS Analog Integrated Circuit Design" by A. B. Grebenn, Published by John Wiley Sons, N.Y.; pp. 193–209.

"How Current Sense Technology Improves Power Mosfet Switching Applications" by D. L. Zaremba, Jr.; Electron Mini/Micro Northeast Conf. Rec. 1986, pp. 10/4.1 to 10/4.4.

IBM Technical Disclosure Bulletin, vol. 25, No. 7B, Dec. 1982, pp. 3363 and 3364, D. R. Presley, W. R. Yount, "Constant Current Source for Energizing Active Inductive Loads".

Primary Examiner—Timothy P. Callahan
Assistant Examiner—My-Trang Nu Ton
Attorney, Agent, or Firm—Brumbaugh, Graves, Donohue & Raymond

[57] ABSTRACT

A current-limiting circuit provides prevention of an oscillation phenomenon resulting from a feedback of the current-limiting signal, which is generated by the output of an operational amplifier, to an input of the operational amplifier via a current-mirror element. Gain adjusting elements are connected between a first input terminal of the operational amplifier and the common control terminal, and between the first input terminal and the current-mirror terminal, respectively. The gain adjusting elements' impedance ratio is used to adjust the feedback gain and thereby prevent the oscillation phenomenon. Furthermore, inputting a selected analog voltage into a second input terminal of the operational amplifier maintains the currents constant at two or more desired levels. In addition, a constant voltage source that can be used even with a low power source voltage, and which is suitable for a current-limiting circuit, is provided by connecting a depletion-type MOSFET and an enhancement-type MOSFET in series.

50 Claims, 19 Drawing Sheets

CURRENT-LIMITING CIRCUIT

BACKGROUND OF THE INVENTION

The present invention relates to a current-limiting circuit and a constant voltage source for the current-limiting circuit, and particularly to a current-limiting circuit that is used to control the output current from a power semiconductor element, which element is in turn controlled by input signals to a control terminal made of, for example, a metal oxide semiconductor field effect transistor (MOSFET), an insulated gate bipolar transistor (IGBT) or a bipolar power transistor.

A current-limiting circuit designed to prevent breakdown of power semiconductor elements due to an excessive current, or an "overcurrent," and to control current flowing into a load at a constant value, is known in the art. A protective circuit for preventing a breakdown caused by an overcurrent, which circuit is shown in FIG. 2, is described by D. L. Zaremba Jr. in "How Current Sense Technology Improves Power MOSFET Switching Applications," *Electro. Mini/Micro Northeast Conf. Rec.*, E. 10/4, pp. 1–4 (1986). In this circuit, an N-channel MOSFET 12 acts as a current mirror element through which flows a shunt current (sense current) $I_S$ which is proportional to an output current $I_D$ flowing through an N-channel power MOSFET 11 acting as a power semiconductor element or a main semiconductor element. MOSFET 11 has its drain terminal and gate terminal in common with a drain terminal 21 and gate terminal 23 of the MOSFET 12. A current-detection resistor 31 is connected between a current mirror terminal 24, which acts as the source terminal of MOSFET 12, and a source terminal 22 of the MOSFET 11. A constant-voltage source 5 has its positive output terminal 51 connected to a negative terminal 41 of an operational amplifier 4, and a negative output terminal 52 connected to source terminal 22 of the MOSFET 11. The current mirror terminal 24 is connected to a positive input terminal 42 of the op-amp 4, and an overcurrent-signal input terminal 62 of a drive circuit 6 is connected to an output terminal 43 of the op-amp 4. Furthermore, the common gate terminal 23 of the MOSFETs 11 and 12 is connected to a drive output-voltage-output terminal 61 of the drive circuit 6 via a gate resistor 32.

The current-limiting circuit shown in FIG. 2 operates in the following manner. When the output current $I_D$ increases, the sense current $I_S$ also increases proportionately. As a result, the voltage across the current-detection resistor 31 also increases. When this voltage exceeds the output voltage from the constant-voltage source 5, the output terminal 43 of the operational amplifier 4 goes into a high state and causes the drive circuit 6 to sense an overcurrent condition at the connected overcurrent-signal input terminal 62, and the drive circuit turns the output stage transistor 11 off by putting the drive-voltage-output terminal 61 into a low state. These operations prevent overcurrent breakdown of the power semiconductor element 11.

Although the circuit shown in FIG. 2 can prevent an overcurrent breakdown of a power semiconductor element, it cannot maintain a constant current level in the load. The current-limiting circuit shown in FIG. 3, which achieves the same objective as the circuit of FIG. 2 and is also described in the above-mentioned article by Zaremba Jr., addresses this constant-current control problem. Parts shown in FIG. 3 which are identical to those shown in FIG. 2 are given the same numeral. In this circuit, the current mirror terminal 24 is connected to the negative input terminal 41 of the operational amplifier 4, the positive output terminal 51 of the constant-voltage source 5 is connected to the positive input terminal 42, and the common gate terminal 23 is connected to the output terminal 43 of the op-amp 4 via a gate resistance 33.

This current-limiting circuit operates in the following manner. When the output current $I_D$ is small, the sense current $I_S$ is also proportionally small, and the voltage between both ends of the current-detection resistor 31 is low. In contrast, when the output current $I_D$ is large, the voltage between both ends of the current-detection resistor 31 is high. Therefore, when the output current $I_D$ is small and the voltage $V_S$ across the current-detection resistor 31 is lower than the output voltage $V_{REF}$ of the constant-voltage source 5, the output terminal 43 of the operational amplifier 4 produces a sufficient voltage to maintain sufficiently high electric conductivity in the normally-turned-on, output-stage transistor 11.

Next, when the output current $I_D$ increases and the $V_S$ becomes greater than the $V_{REF}$, the output voltage at the output terminal 43 of the operational amplifier decreases and the electric conductivity of the output-stage transistor 11 decreases because of a drop in the voltage applied to the gate terminal 23. As a result, it is more difficult for the output current $I_D$ to flow, and the current is maintained below a certain value.

The current-limiting circuit shown in FIG. 3 has two drawbacks. One is an oscillation phenomenon. The output from the operational amplifier 4 is fed back to the negative input terminal of the operational amplifier 4 through the current-mirror transistor 12. The gain in this feedback loop is nearly equivalent to the gain in the operational amplifier 4, which is normally close to 100 dB. In addition, a phase delay occurs at the output terminal 43 of the operational amplifier 4, which carries as large a load as the output-stage transistor 11. As a result, a feedback loop that can easily cause a high gain with a phase delay is formed in the current-limiting circuit 3, allowing the oscillation phenomenon to occur more frequently.

Another drawback of the circuit shown in FIG. 3 is that, because the current is maintained at a constant value, the circuit cannot be used to maintain multiple levels of constant current.

The constant-voltage source 5 shown in FIGS. 2 and 3 has been described in detail in "Bipolar and MOS Analog Integrated Circuit Design" written by A. B. Grebenn and published by John Wiley Sons, New York.

Other current-limiting circuits such as band-gap reference circuits and circuits using constant voltage characteristics in Zener diodes are also known. However, the band-gap reference circuit has disadvantages of increased device size and costs. The circuit utilizing constant voltage characteristics in Zener diodes has a disadvantage of the voltage deviating from the constant voltage if it drops below the breakdown voltage, which is normally 6 V to 8 V in Zener diodes.

It is an objective of the present invention to solve the above problems and provide a current-limiting circuit that exhibits no oscillation phenomenon.

It is another object of the present invention to provide a current-limiting circuit that can be used to control constant currents at multiple levels.

It is yet another object of the present invention to provide a low cost, constant-voltage source for a current-limiting circuit which can be used with low supply voltage.

SUMMARY OF THE INVENTION

In order to achieve the above objectives, the present invention provides a current-limiting circuit in which first and second main terminals of a main semiconductor element are used as the terminals of the circuit, while the output current from the main semiconductor element is suppressed below a certain value by controlling the input to the control terminal of the main semiconductor element. The input of the main semiconductor element is controlled by the output of an operational amplifier, which output is in turn generated by comparing a reference voltage with the voltage between the two terminals of a current-detection element.

The current-detection element is connected between a second main terminal of a current-mirror element and the second main terminal of the main semiconductor element. A current that is proportional to the output current flowing across the first main terminal and the second main terminal of the main semiconductor element flows through the current-mirror element. The reference voltage is applied to a first input terminal of the operational amplifier, and a first gain-adjusting element is connected between the second input terminal and the second main terminal of the current-mirror element. A second gain-adjusting element, which has an impedance of a predetermined ratio relative to impedance of the first gain adjusting element, is connected between the control terminals of the main semiconductor element.

In the present invention, it is preferable that the output terminal of the operational amplifier be connected to a drive circuit in which the main terminal is connected to the control terminals of the main semiconductor element. The op-amp's output terminal is also connected to the control terminal of a switching element connected to the second main terminal of the main semiconductor element, or alternatively, connected to the control terminal of the main semiconductor element. In these arrangements, it is preferable that the connection to the control terminal of the main semiconductor element is made via a resistor that limits the operating speed of the main semiconductor element. It is also preferable that the reference voltage is an output voltage from the constant-voltage source connected between the first input terminal of the operational amplifier and the second main terminal of the main semiconductor element. Alternatively, the reference voltage is an analog voltage applied to the first input terminal of the operational amplifier.

Next, the power source for the current-limiting circuit according to the present invention is formed in such a manner that a depletion-type MOSFET, which has a gate terminal and a source terminal tied to a common output terminal, is connected in series with an enhancement-type MOSFET, which has a gate terminal and a drain terminal tied to the common output terminal.

If the impedance of the first and second gain adjusting elements connected to one of the input terminals of the operational amplifier is assumed to be Z1 and Z2, respectively, then gain A, i.e., the ratio of a change in the voltage at the control terminal of the main semiconductor element relative to a change in the voltage at the second main terminal of the current-mirror element connected to one end of the current detection element, is determined by the following formula:

$$A = -|Z2|/|Z1|$$

Therefore, the gain A can be adjusted by setting the impedance Z1 and Z2 in the first and second gain adjusting elements to a predetermined value. Since the oscillation phenomenon in the current-limiting circuit as described above is caused by an excessive gain and phase delay, setting the gain A sufficiently small by adjusting impedances Z1 and Z2 as above will prevent the oscillation phenomenon.

Furthermore, if a resistor is inserted between the output terminal of the drive circuit or the operational amplifier and the control terminal of the main semiconductor element, frequencies with shorter cycles than the time constant $R_G \cdot C$, i.e., the product of the resistance value $R_G$ of the resistor and the input capacity C of the control terminal of the main semiconductor element, are entirely eliminated. As a result, no oscillation phenomenon occurs even if a phase delay develops.

Another advantage of the present invention is that it is possible to control constant currents at two or more levels by making the input into the first input terminal of the operational amplifier a variable analog voltage, rather than a constant voltage, by varying the current-limiting levels through selection of the levels of the analog voltage being applied.

In a circuit that has a depletion-type MOSFET with its gate terminal and source terminal connected in common to an enhancement-type MOSFET's gate terminal and drain terminal, the drain current $I_{DD}$ of the depletion-type MOSFET is a constant value if the voltage $V_{DSD}$ between the drain and the source is higher than the constant value $V_{DSSat}$, and the drain current is expressed by the following formula:

$$I_{DD} = (\mu_D C_{OXD} W_D / 2 L_D) V_{THD}^2$$

where $\mu_D$ is the degree of the carrier movement, $C_{OXD}$ is the gate oxide film capacity, $W_D$ is the channel width, $L_D$ is the channel length, and $V_{THD}$ is the threshold voltage. The drain current $I_{DE}$ in the enhancement-type MOSFET can be determined by the following formula, with the voltage between the drain and the source depending on $V_{DSE}$:

$$I_{DE} = (\mu_E C_{OXE} W_E / 2 L_E)(V_{DSE} - V_{THE})^2$$

where $\mu_E$ is the degree of carrier movement, $C_{OXE}$ is the gate oxide film capacity, $W_E$ is the channel width, $L_E$ is the channel length, and $V_{THE}$ is the threshold voltage. Since the depletion-type MOSFET and the enhancement-type MOSFET are connected in series, $I_{DD} = I_{DE}$, and the following formula can be derived:

$$V_{DSE} = (\mu_D C_{OXD} W_D L_E / \mu_E C_{OXE} W_E L_D)^{\frac{1}{2}} V_{THD} + V_{THE}$$

As can be seen, $V_{DSE}$ becomes constant and can be used as a constant-voltage source. Moreover, since the minimum power source voltage which serves as a constant-voltage source is $V_{DSSat}$ or $V_{DSE}$, and the value of $V_{DSSat}$ is generally about one volt, as is the value of $V_{THE}$, the value of $V_{DSE}$ may be set to 1 V to 2 V, and the value of $V_{DSSat} + V_{DSE}$ may be set to 2 V to 3 V in this case. Accordingly, it is possible to maintain a constant-voltage source at a power source voltage as low as 2 V to 3 V.

DETAILED DESCRIPTION OF THE INVENTION

Figure 1:
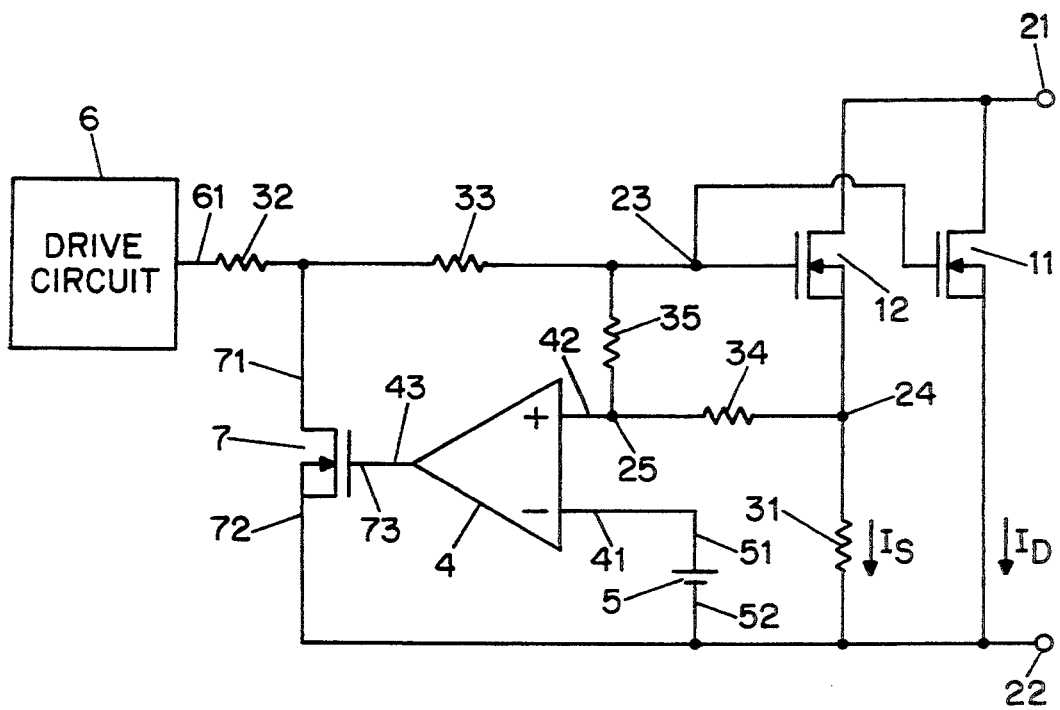
FIG. 1 is a circuit diagram of a current-limiting circuit according to a preferred first embodiment of the present invention.

FIG. 1 shows a first embodiment of a current-limiting circuit according to the present invention, which circuit effectively prevents the occurrence of an oscillation phenomenon. In this circuit, the output terminal of the operational amplifier 4 is connected to a gate terminal 73 of a gate controlling N-channel MOSFET 7 as a switching element, and a source terminal 72 of the MOSFET 7 is connected to the negative output terminal 52 of a constant-voltage source 5, which output terminal 52 is in turn connected in common to the source terminal 22 of the output-stage transistor 11 which is the main semiconductor element of the current limiting circuit. A drain terminal 71 of the MOSFET 7 is connected via a gate resistor 32 to a drive-voltage output terminal 61 of a drive circuit 6, as well as to a common gate terminal 23 via a gate resistor 33. Furthermore, gain adjusting resistors 34 and 35 are connected between a current mirror terminal 24 and the common gate terminal 23, and the resistors 34 and 35 are connected at a point 25 which also serves as the positive input terminal 42 of the operational amplifier 4.

In this circuit, when $I_D$ increases and the voltage $V_S$ across a detection resistor 31 exceeds the voltage $V_{th}$ of the constant-voltage source 5, an output terminal 43 of the operational amplifier 4 goes into a high state. At this point, the gate controlling transistor 7 is turned on and pulls the drive current away from the drive circuit 6 and towards the source terminal 22, thereby decreasing the voltage applied to the common gate terminal 23. Unlike the conventional current-limiting circuit shown in FIG. 2, the power semiconductor element 11 does not turn off at this point, but rather, its electric conductivity drops. Hence, the circuit acts as a current-limiting circuit to constantly limit the output current from the element 11.

In the circuit shown in FIG. 1, it is necessary to match the gate controlling transistor 7 and the gate resistor 32. In addition, the ratio of the change in the gate voltage applied to the gate terminal 23 relative to the change in the voltage $V_S$, which ratio is also called the gain, can be adjusted by adjusting the gain adjusting the resistance values of the resistors 34 and 35. The resistor 34 is connected between the positive input terminal 42 of the operational amplifier 4 and the current-mirror terminal 24, and the resistor 35 is connected between the terminal 42 and the gate terminals 23. With this arrangement of resistors, oscillation phenomena due to excessive gain can be prevented. While the desired ratio of the resistance values of the gain adjusting resistors 34 and 35 depends on the amount of phase delay, the value of the resistor 35 is normally increased such that the ratio is about 500 to 50,000 as a reference.

If the ratio of the main current $I_D$ to the sense current $I_S$, $I_D:I_S$, is assumed to be n:1, the current limit of this circuit is expressed by the following formula (1):

$$I_{Dmax} = n \cdot V_{REF}/R_S \qquad (1)$$

$R_S$ the resistance value of the detection resistor 31. The values for the gain adjusting resistors 34 and 35 must be sufficiently large relative to the resistance $R_S$ in the detection resistor 31.

Figure 3:
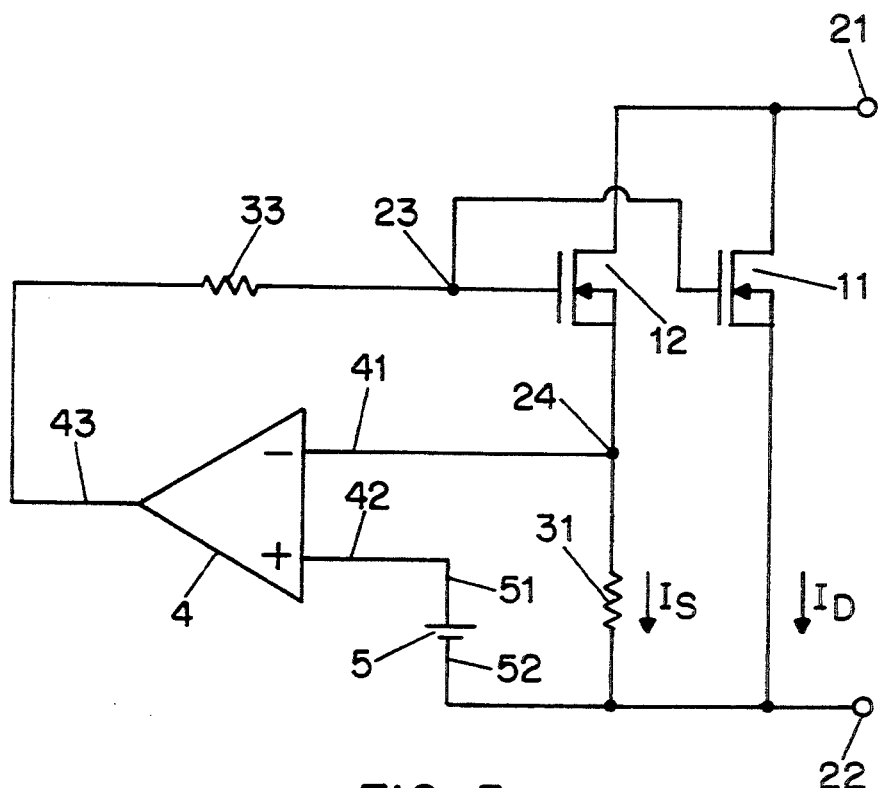
FIG. 3 is a circuit diagram of another conventional current-limiting circuits.
Figure 4:
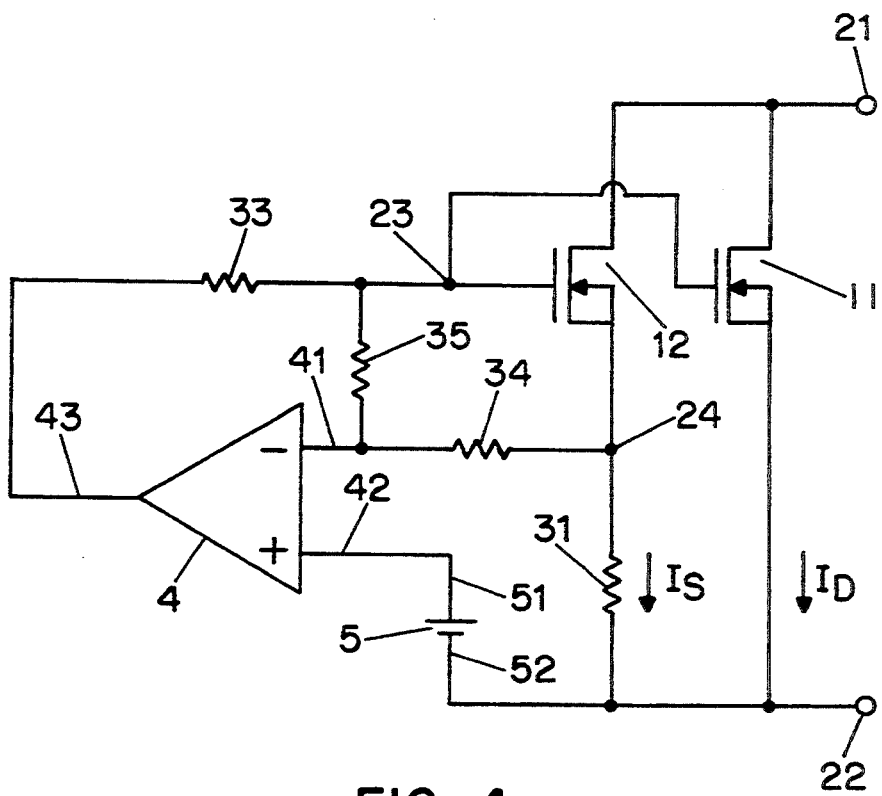
FIG. 4 is a circuit diagram of a current-limiting circuit according to a preferred second embodiment of the present invention.

FIG. 4 shows a second embodiment of a current-limiting circuit according to the present invention which prevents the occurrence of oscillation phenomena. Unlike the circuit shown in FIG. 3, the gain adjusting resistor 34 is connected between the negative input terminal 41 of the operational amplifier 4 and the current-mirror terminal 24, while the gain adjusting resistor 35 is connected between input terminal 41 and the common gate terminal 23. With this arrangement of resistors, the ratio of the change in the gate voltage applied to the gate terminal 23 relative to a change in the voltage $V_S$, i.e., the gain, can be adjusted to prevent an excessive gain, which is one of the causes of the oscillation phenomenon plaguing the circuit shown in FIG. 1. The current-limit value, $I_{Dmax}$, is also expressed by the formula (1).

Figure 5:
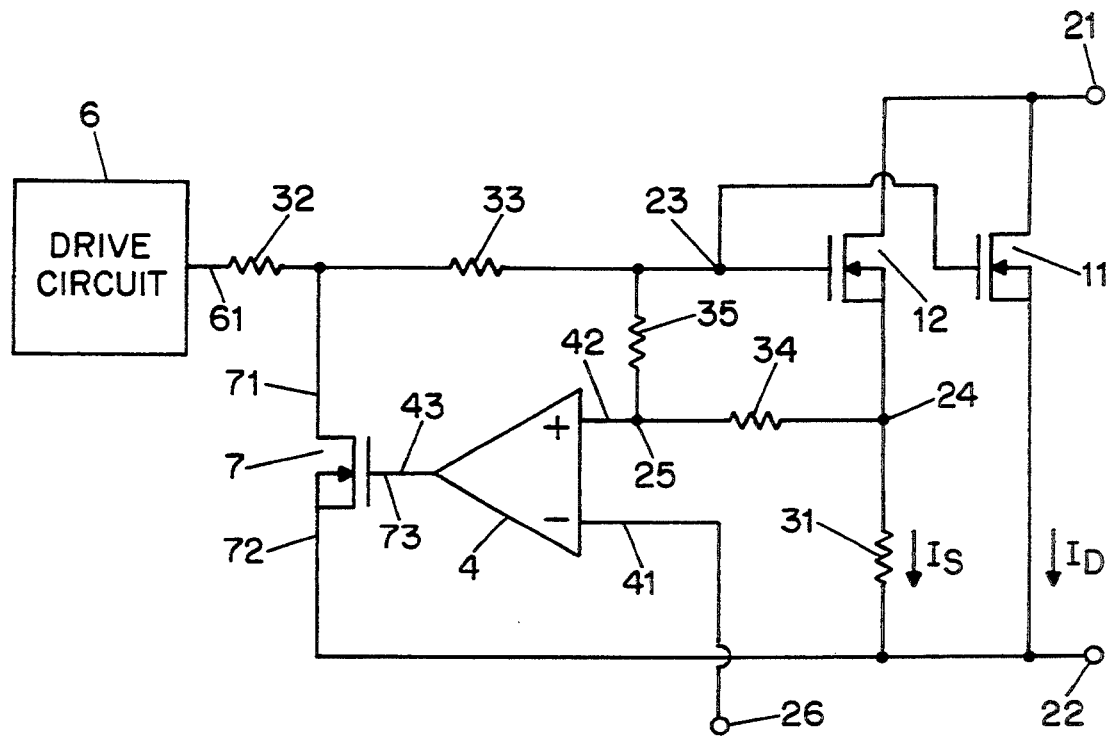
FIG. 5 is a circuit diagram of a current-limiting circuit according to a preferred third embodiment of the present invention.

FIG. 5 shows a third embodiment of a current-limiting circuit according to the present invention, which circuit prevents oscillation phenomenon and maintains currents constant at two or more levels. Unlike the circuit shown in FIG. 1, the input to the negative input terminal 41 of the operational amplifier 4 is not a constant voltage, but rather an optional analog voltage that is applied to an analog input terminal 26. Current limit levels of the output current $I_D$ are optional according to the level of this analog voltage. Accordingly, the current-limiting value $I_{Dmax}$ is expressed by the following formula (2):

$$I_{Dmax} = n \cdot V_{IN}/R_S \qquad (2)$$

$V_{IN}$ is the analog input voltage at the terminal 26.

Figure 6:
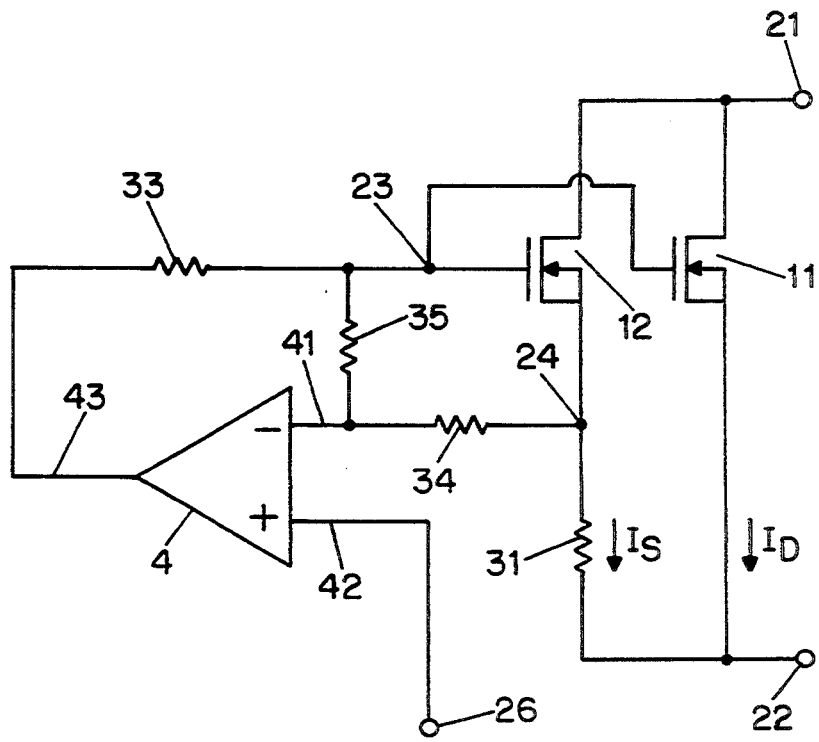
FIG. 6 is a circuit diagram of a current-limiting circuit according to a preferred fourth embodiment of the present invention.

FIG. 6 shows a fourth embodiment of a current-limiting circuit of the present invention, which circuit prevents oscillation phenomena and which maintains currents constant at two or more levels. This circuit differs from the circuit shown in FIG. 4 in that the circuit in FIG. 6 is connected to an analog input terminal 26, through which a selected analog voltage may be applied to the positive input terminal 42 of the operational amplifier 4. This allows the current-limit value $I_{Dmax}$ to be a desired value expressed by the formula (2).

The detection resistor 31 simplifies the circuit design because the voltage across the resistor is directly proportional to the output current from the output-stage transistor 11. Moreover, the resistor facilitates current control because the current-limiting value in the current-limiting circuits shown in FIG. 5 and 6 is directly proportional to the analog input voltage applied to the terminal 26.

It should be noted that in the circuit shown in FIG. 4, the output-stage transistor 11 is normally in the "on" state. In the circuit shown in FIG. 6, transistor 11 is turned off when the input voltage $V_{IN}$ at the input terminal 26 drops to zero. Accordingly, the MOSFET 11 stays on as long as $V_{IN}$ remains positive, and a current with a maximum value that is determined by the formula (2) from the $V_{IN}$ value in the MOSFET 11 can flow.

Figure 7:
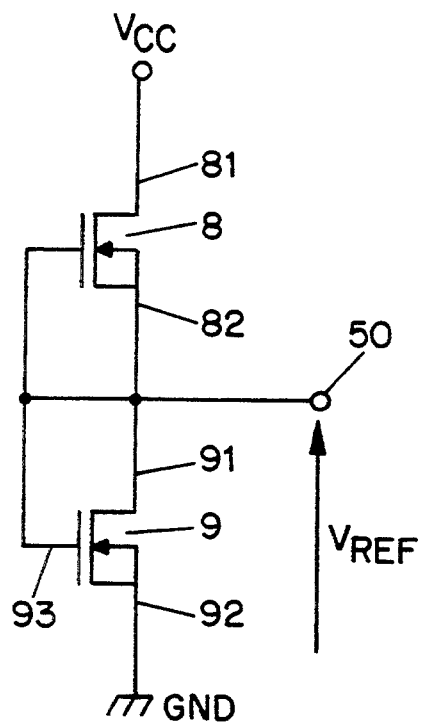
FIG. 7 is a circuit diagram of a constant-voltage source used in one preferred embodiment of the present invention.
Figure 8:
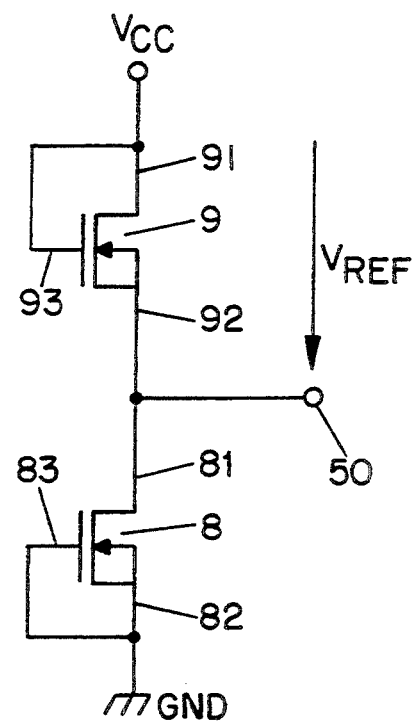
FIG. 8 is a circuit diagram of a constant-voltage source used in another preferred embodiment of the present invention.
Figure 9:
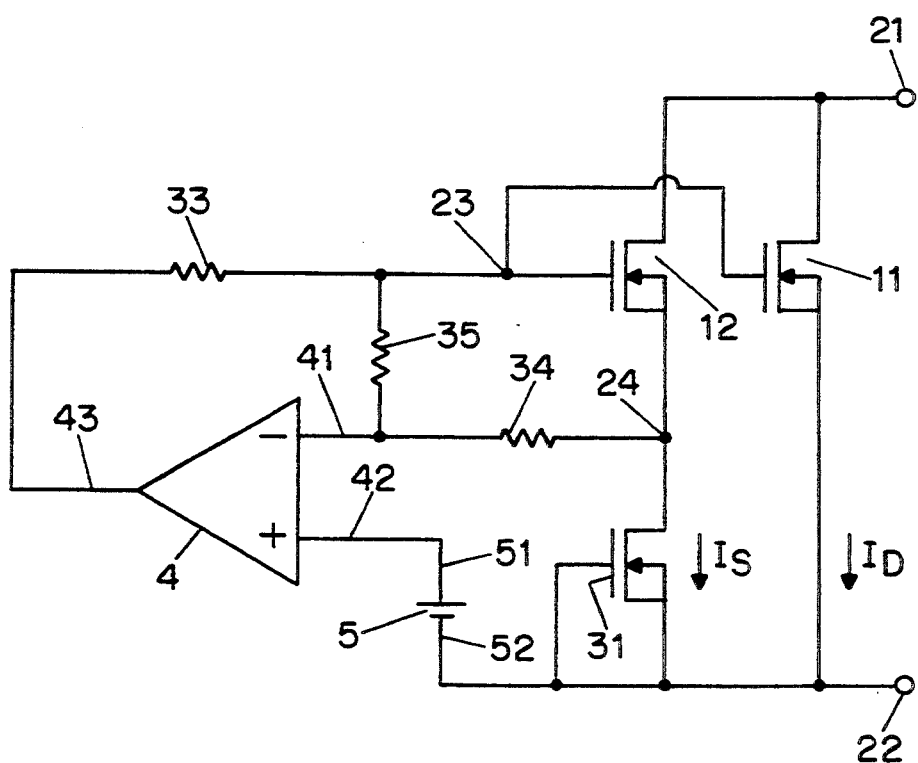
FIG. 9 is a circuit diagram of a current-limiting circuit according to a preferred fifth embodiment of the present invention.
Figure 10:
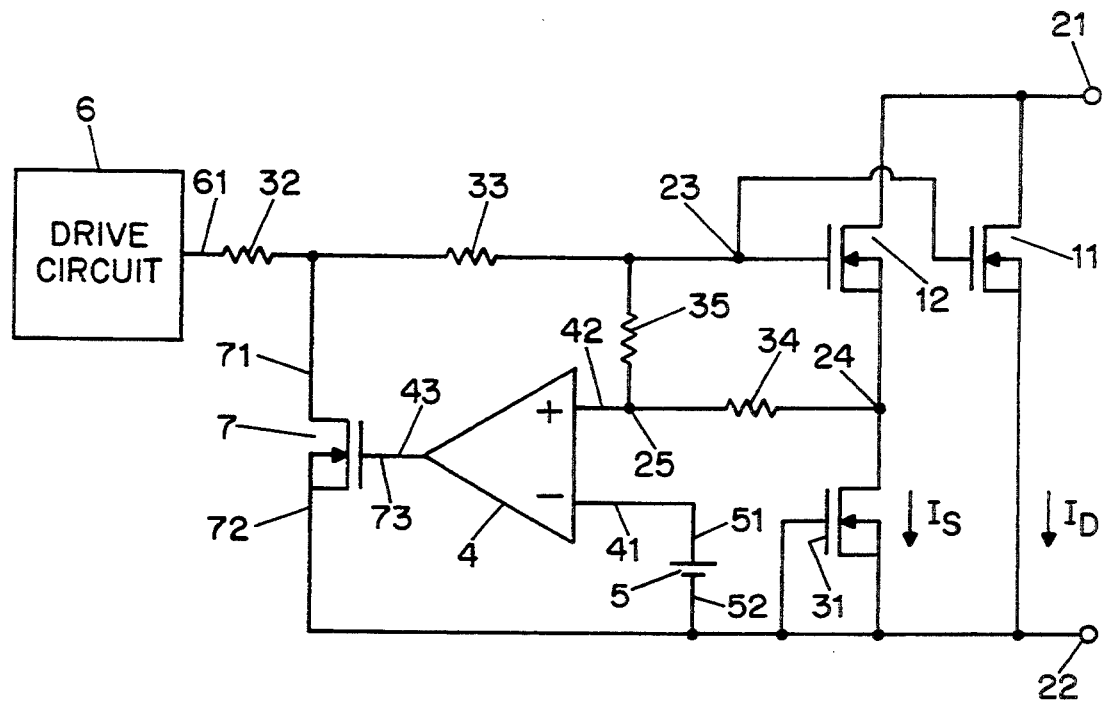
FIG. 10 is a circuit diagram of a current-limiting circuit according to a preferred sixth embodiment of the present invention.
Figure 11:
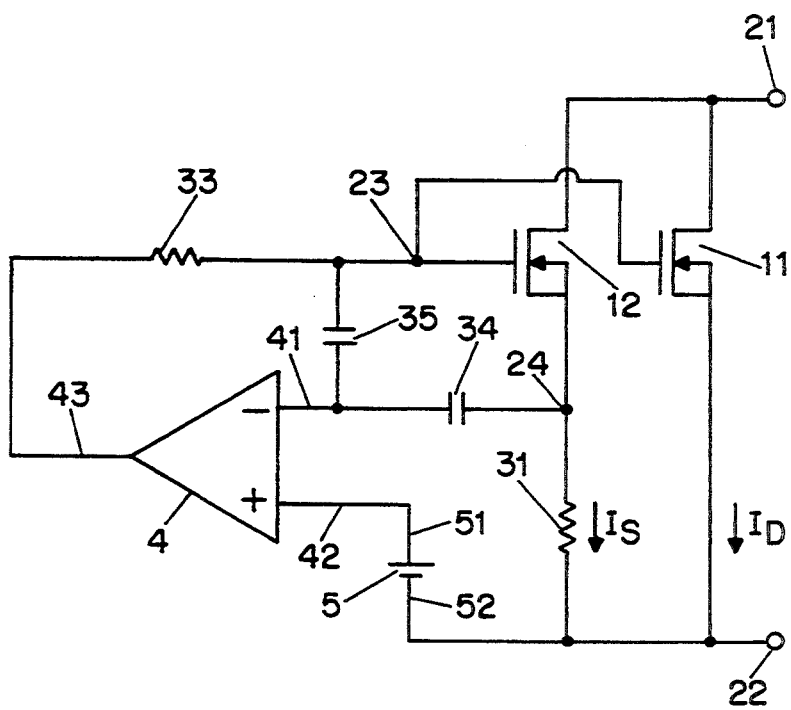
FIG. 11 is a circuit diagram of a current-limiting circuit according to a preferred seventh embodiment of the present invention.
Figure 12:
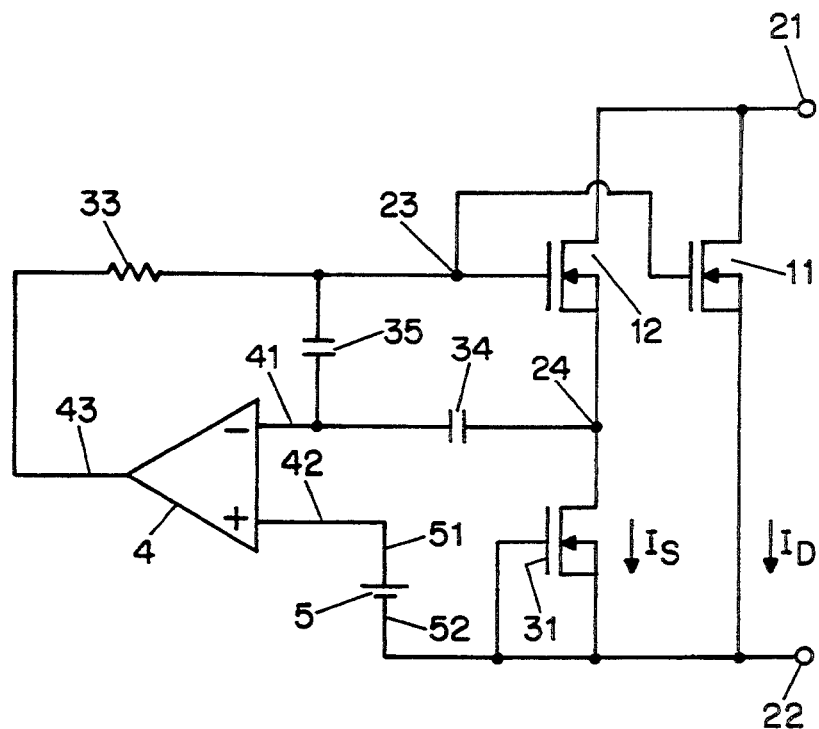
FIG. 12 is a circuit diagram of a current-limiting circuit according to a preferred eighth embodiment of the present invention.
Figure 13:
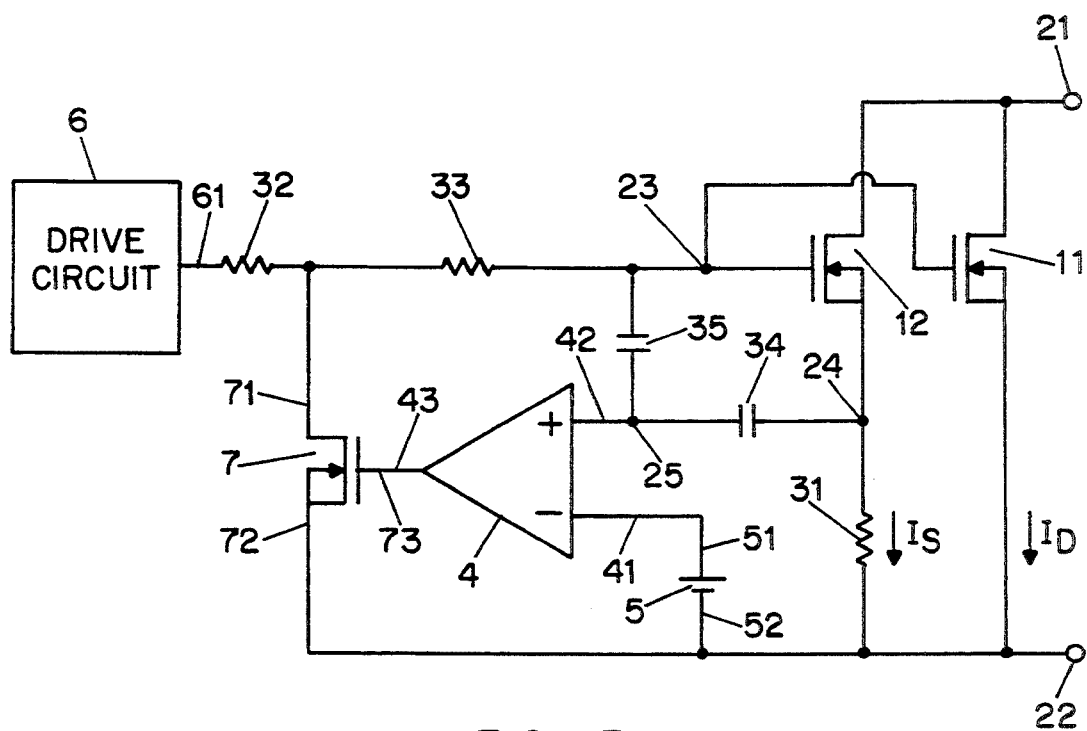
FIG. 13 is a circuit diagram of a current-limiting circuit according to a preferred ninth embodiment of the present invention.
Figure 14:
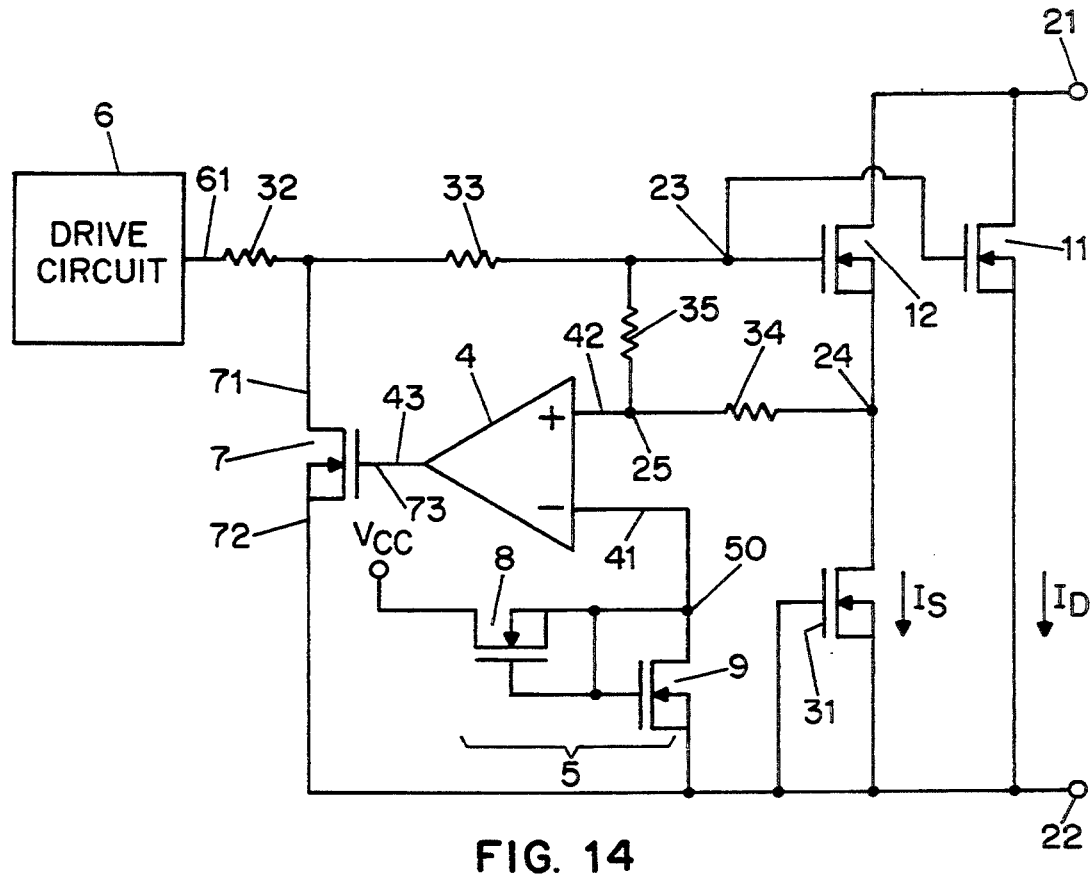
FIG. 14 is a circuit diagram of a current-limiting circuit according to a preferred tenth embodiment of the present invention.
Figure 15:
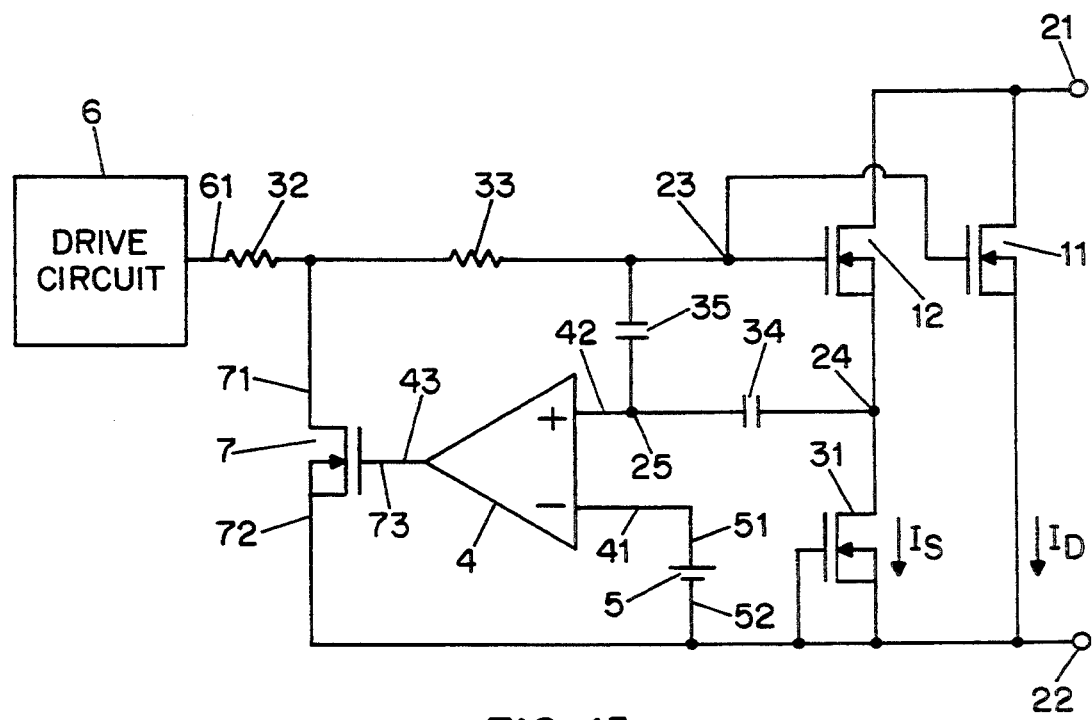
FIG. 15 is a circuit diagram of a current-limiting circuit according to a preferred eleventh embodiment of the present invention.
Figure 16:
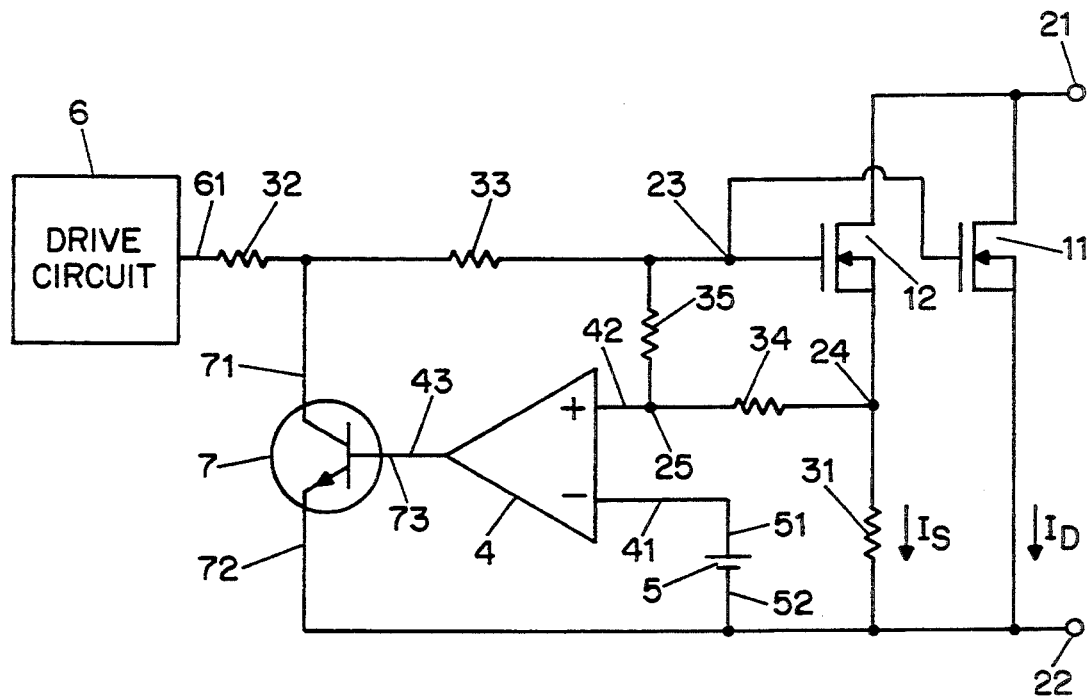
FIG. 16 is a circuit diagram of a current-limiting circuit according to a preferred twelfth embodiment of the present invention.
Figure 17:
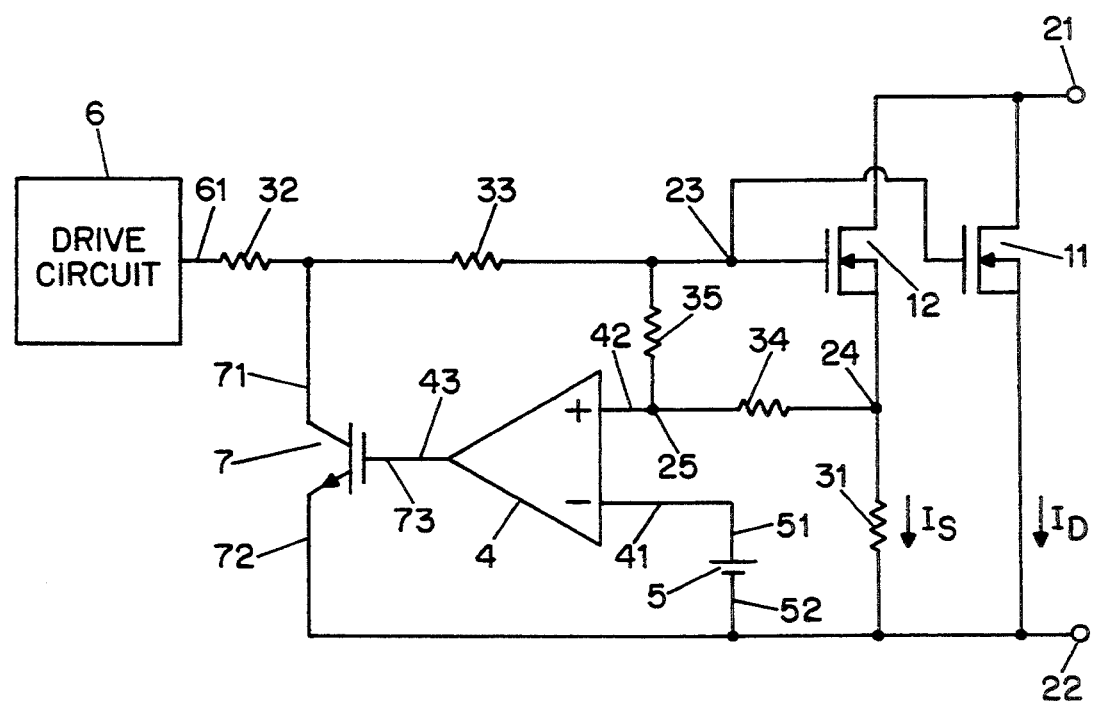
FIG. 17 is a circuit diagram of a current-limiting circuit according to a preferred thirteenth embodiment of the present invention.
Figure 18:
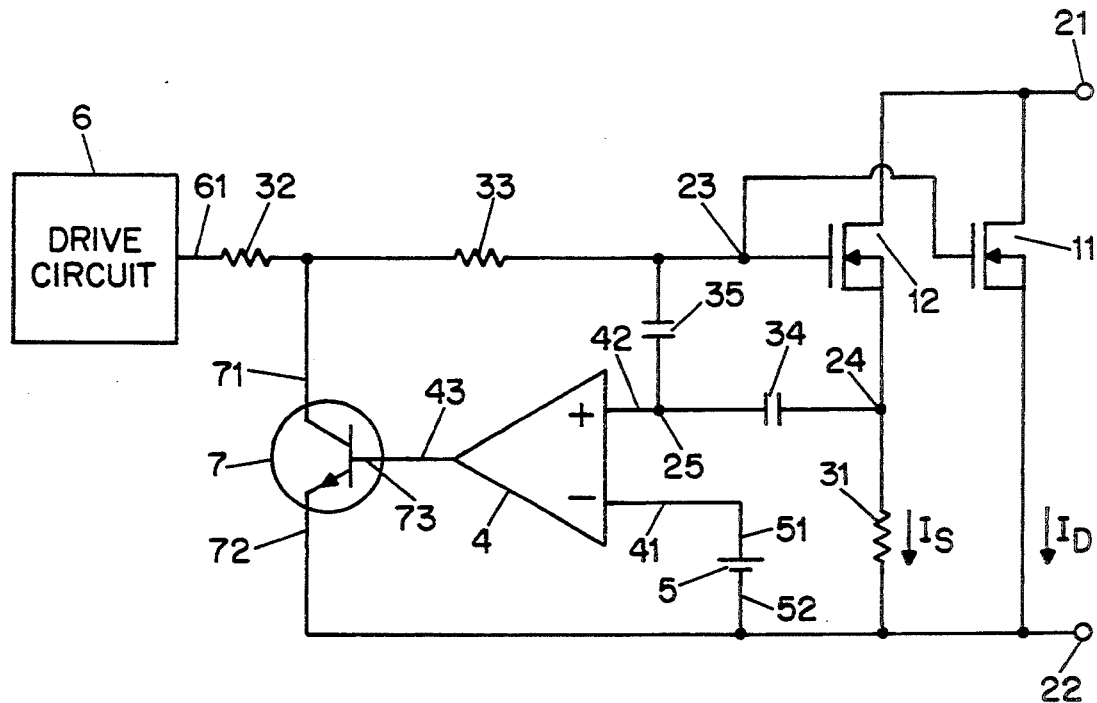
FIG. 18 is a circuit diagram of a current-limiting circuit according to a preferred fourteenth embodiment of the present invention.
Figure 19:
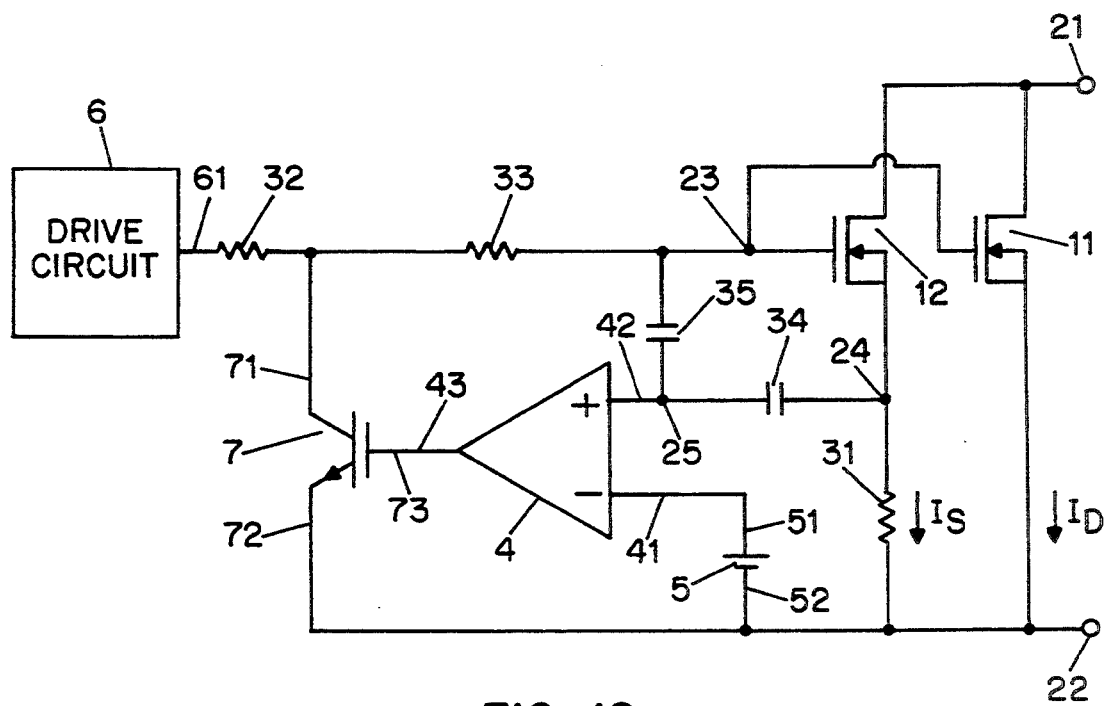
FIG. 19 is a circuit diagram of a current-limiting circuit according to a preferred fifteenth embodiment of the present invention.
Figure 20:
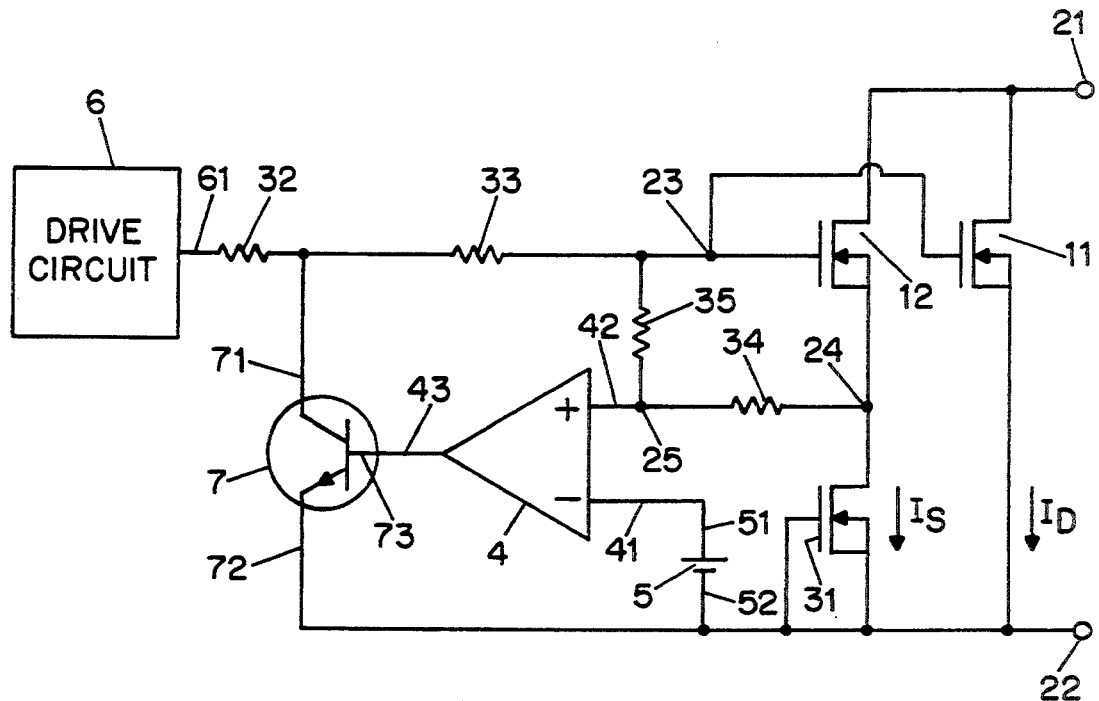
FIG. 20 is a circuit diagram of a current-limiting circuit according to a preferred sixteenth embodiment of the present invention.
Figure 21:
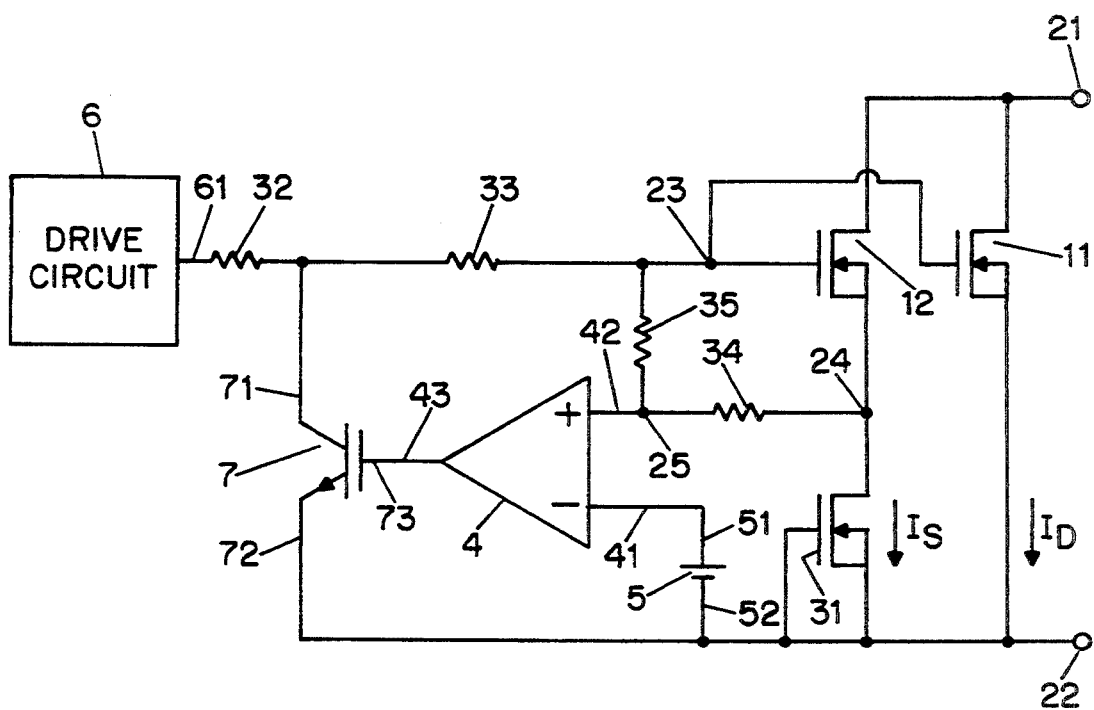
FIG. 21 is a circuit diagram of a current-limiting circuit according to a preferred seventeenth embodiment of the present invention.
Figure 22:
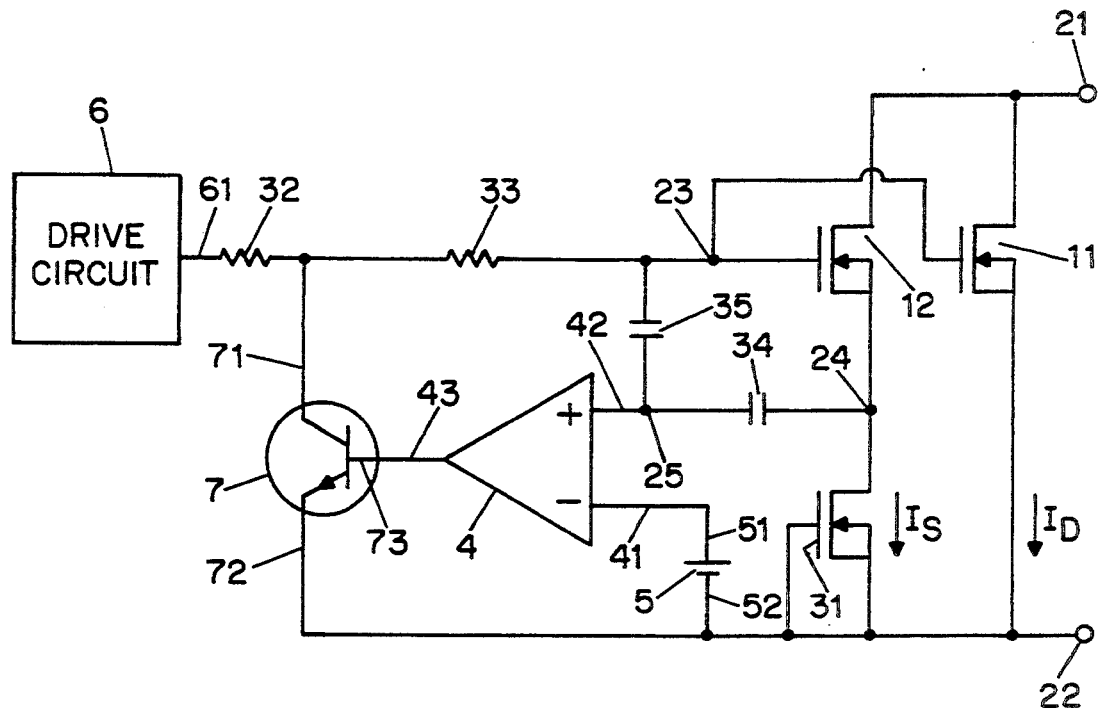
FIG. 22 is a circuit diagram of a current-limiting circuit according to a preferred eighteenth embodiment of the present invention.
Figure 23:
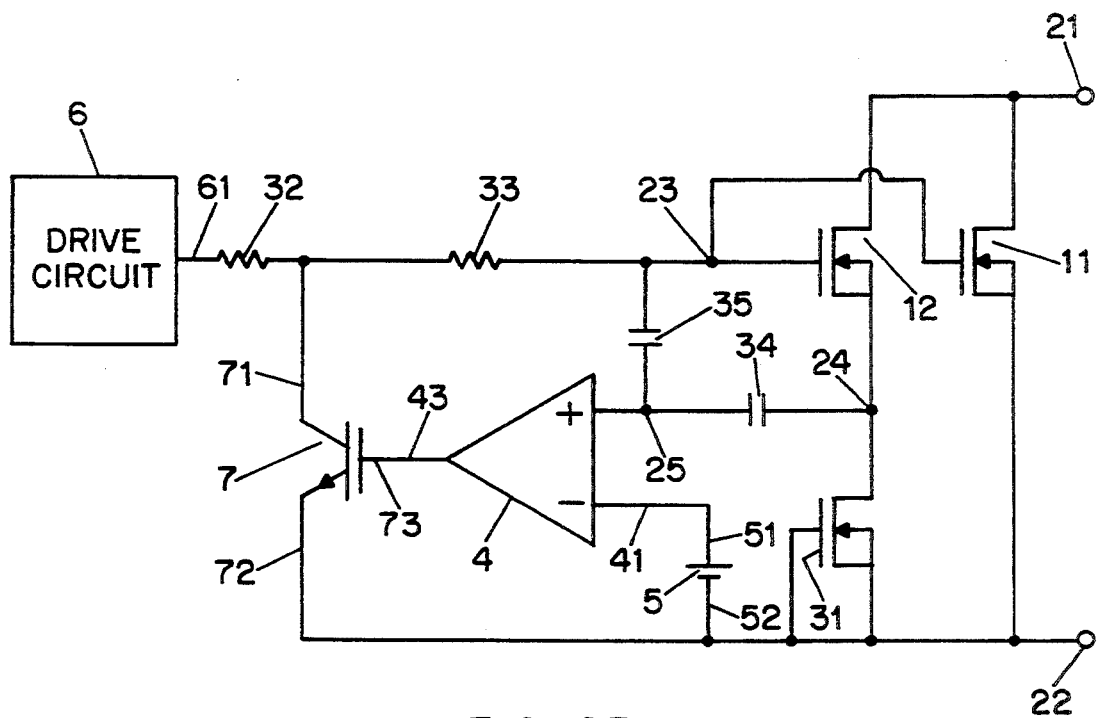
FIG. 23 is a circuit diagram of a current-limiting circuit according to a preferred nineteenth embodiment of the present invention.
Figure 24:
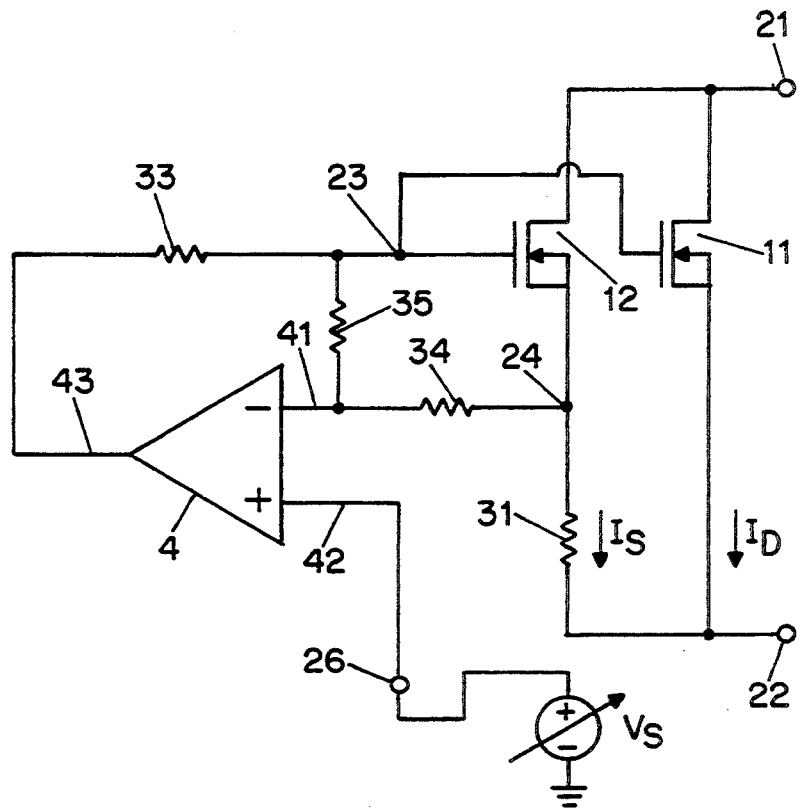
FIG. 24 is a circuit diagram of a current-limiting circuit according to a preferred twentieth embodiment of the present invention.
Figure 25:
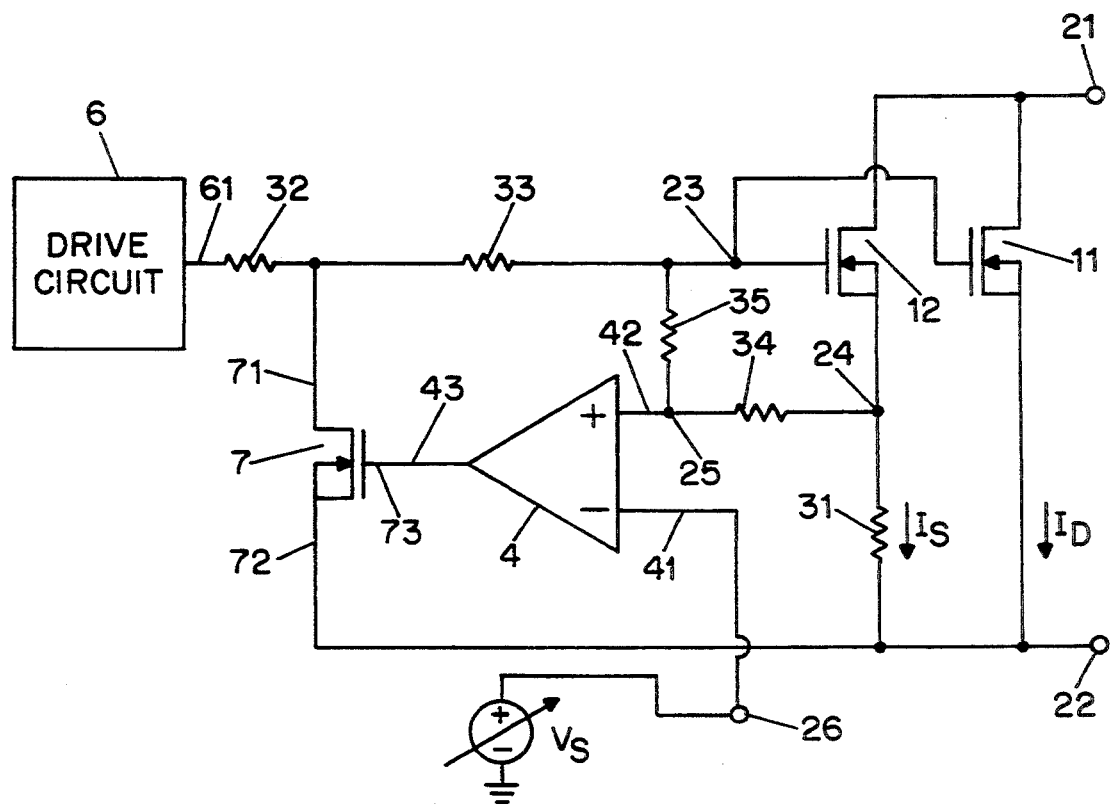
FIG. 25 is a circuit diagram of a current-limiting circuit according to a preferred twenty-first embodiment of the present invention.
Figure 26:
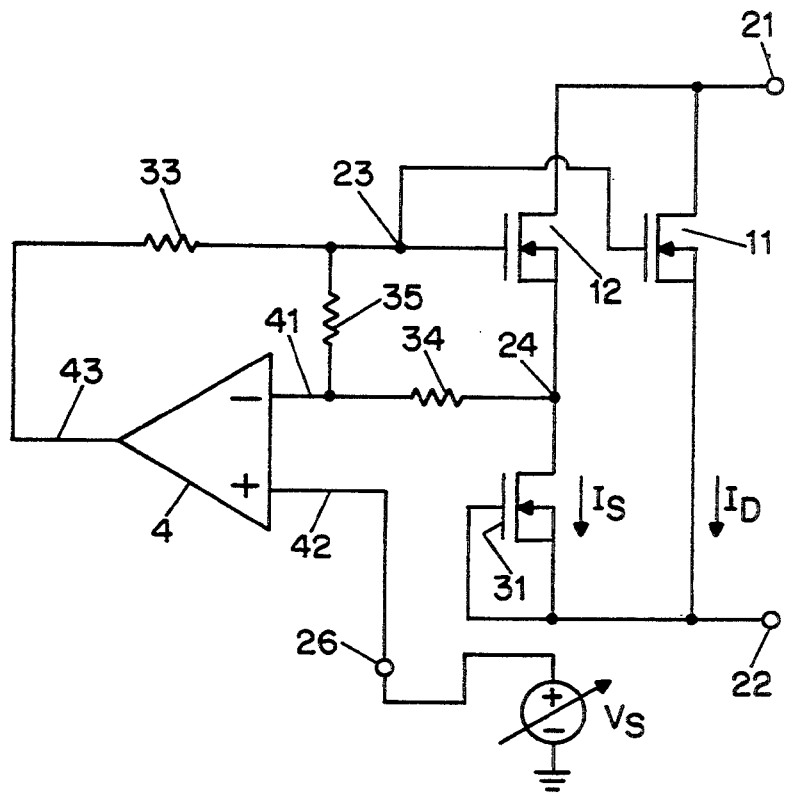
FIG. 26 is a circuit diagram of a current-limiting circuit according to a preferred twenty-second embodiment of the present invention.
Figure 27:
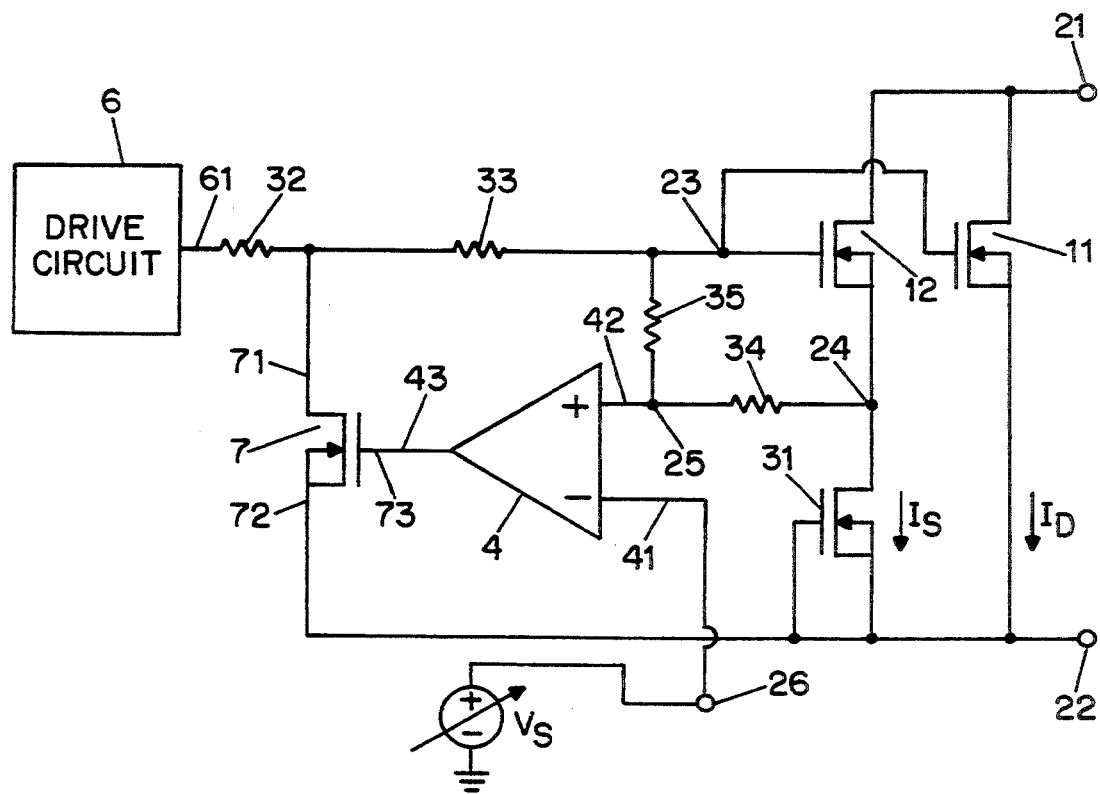
FIG. 27 is a circuit diagram of a current-limiting circuit according to a preferred twenty-third embodiment of the present invention.
Figure 28:
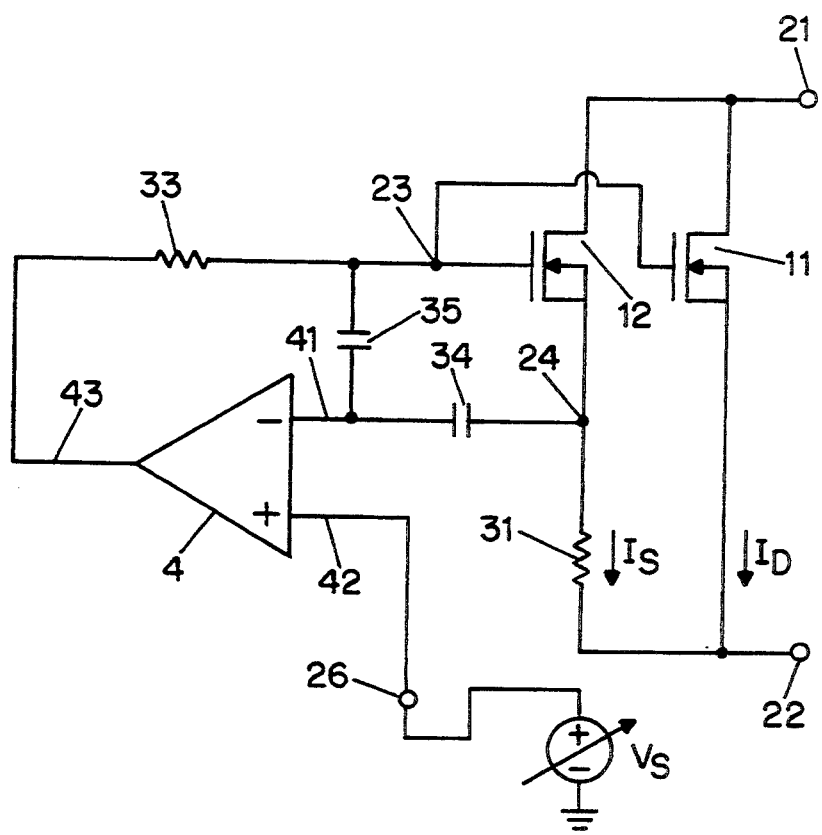
FIG. 28 is a circuit diagram of a current-limiting circuit according to a preferred twenty-fourth embodiment of the present invention.
Figure 29:
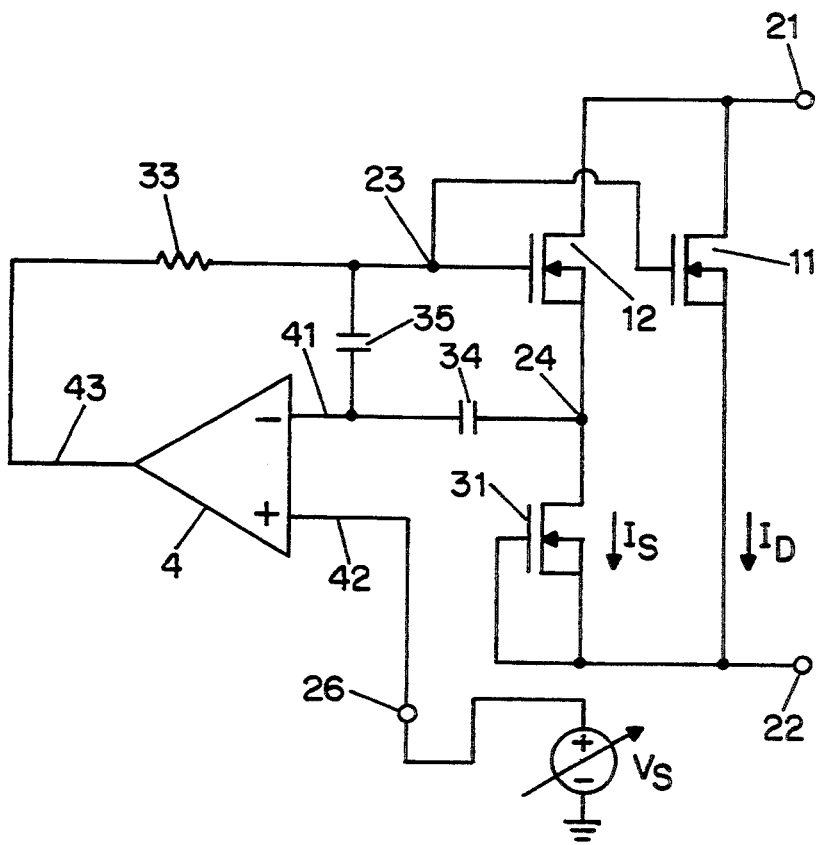
FIG. 29 is a circuit diagram of a current-limiting circuit according to a preferred twenty-fifth embodiment of the present invention.
Figure 30:
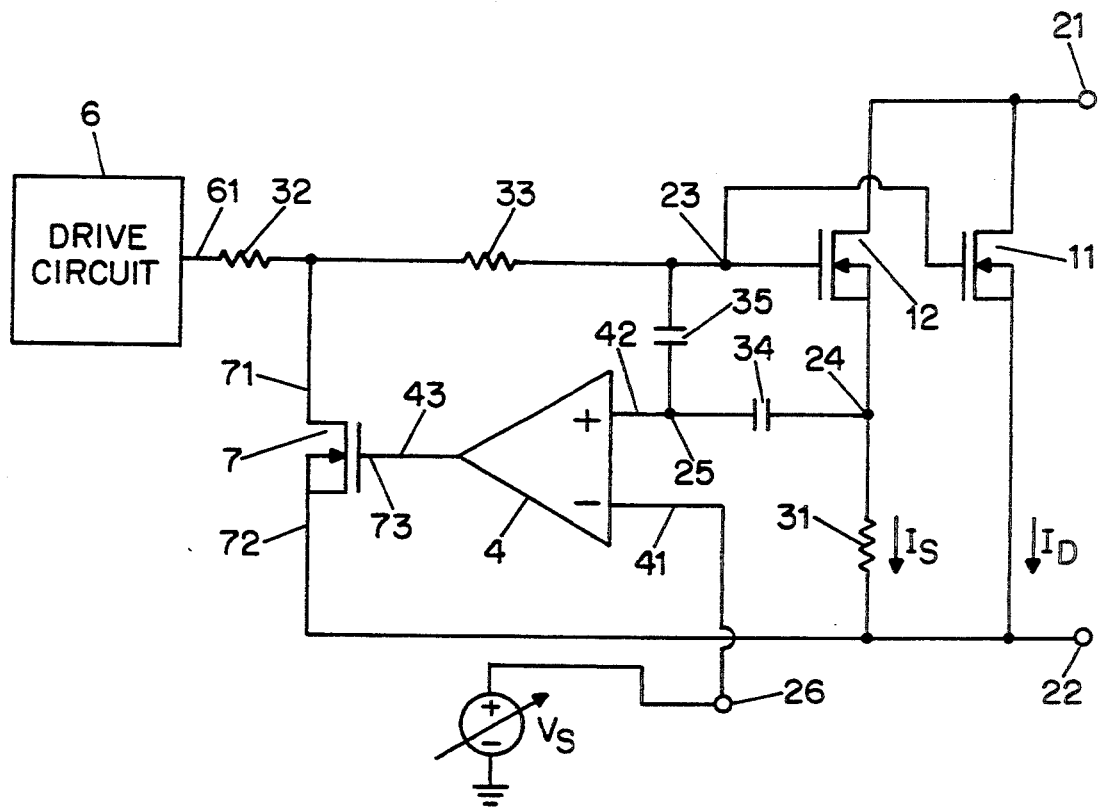
FIG. 30 is a circuit diagram of a current-limiting circuit according to a preferred twenty-sixth embodiment of the present invention.
Figure 31:
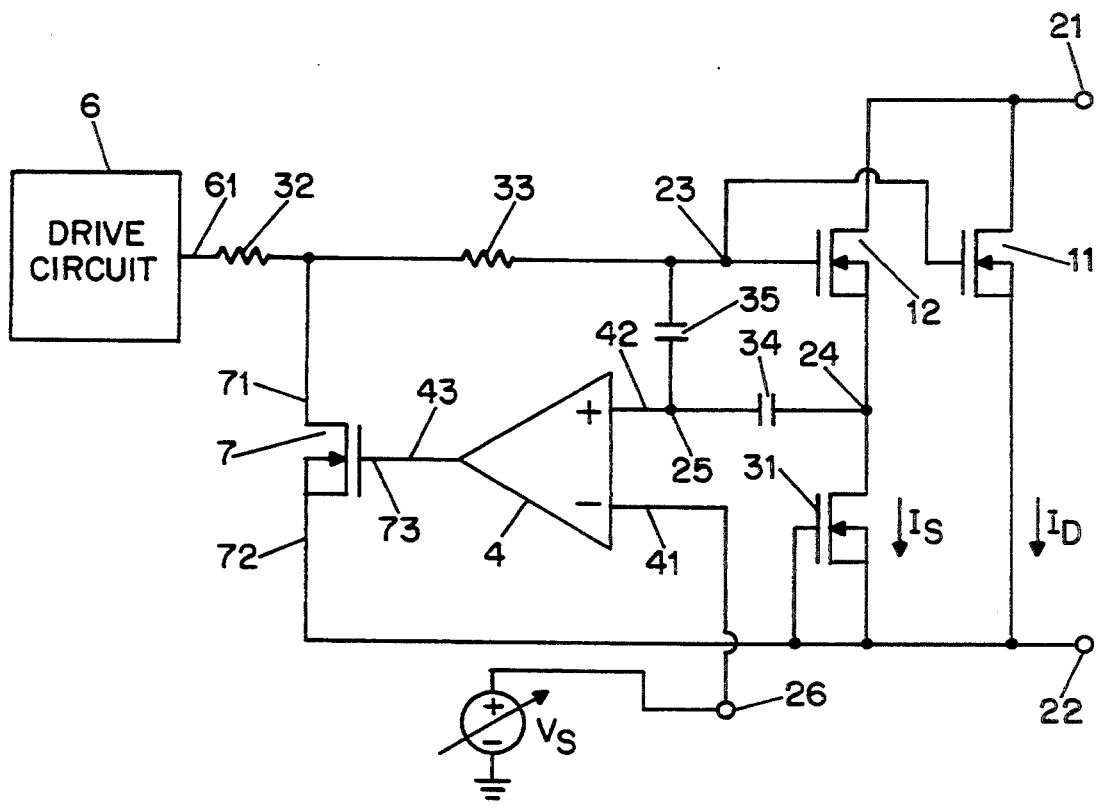
FIG. 31 is a circuit diagram of a current-limiting circuit according to a preferred twenty-seventh embodiment of the present invention.
Figure 32:
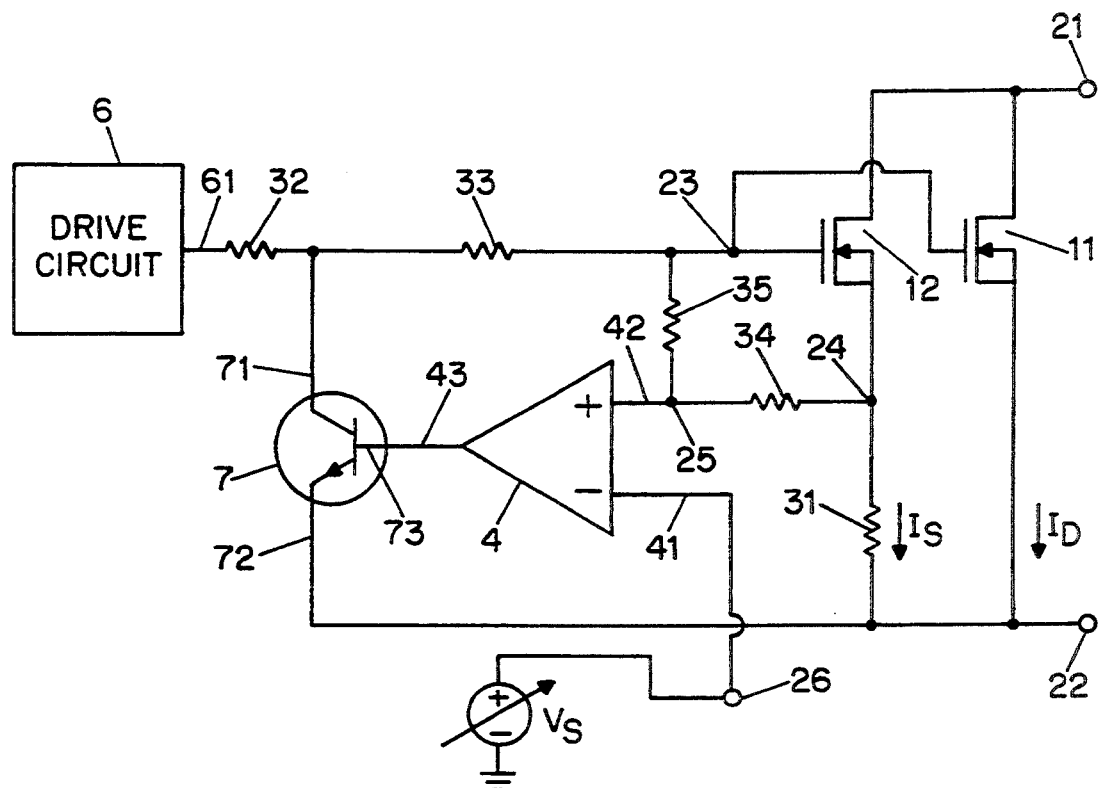
FIG. 32 is a circuit diagram of a current-limiting circuit according to a preferred twenty-eighth embodiment of the present invention.
Figure 33:
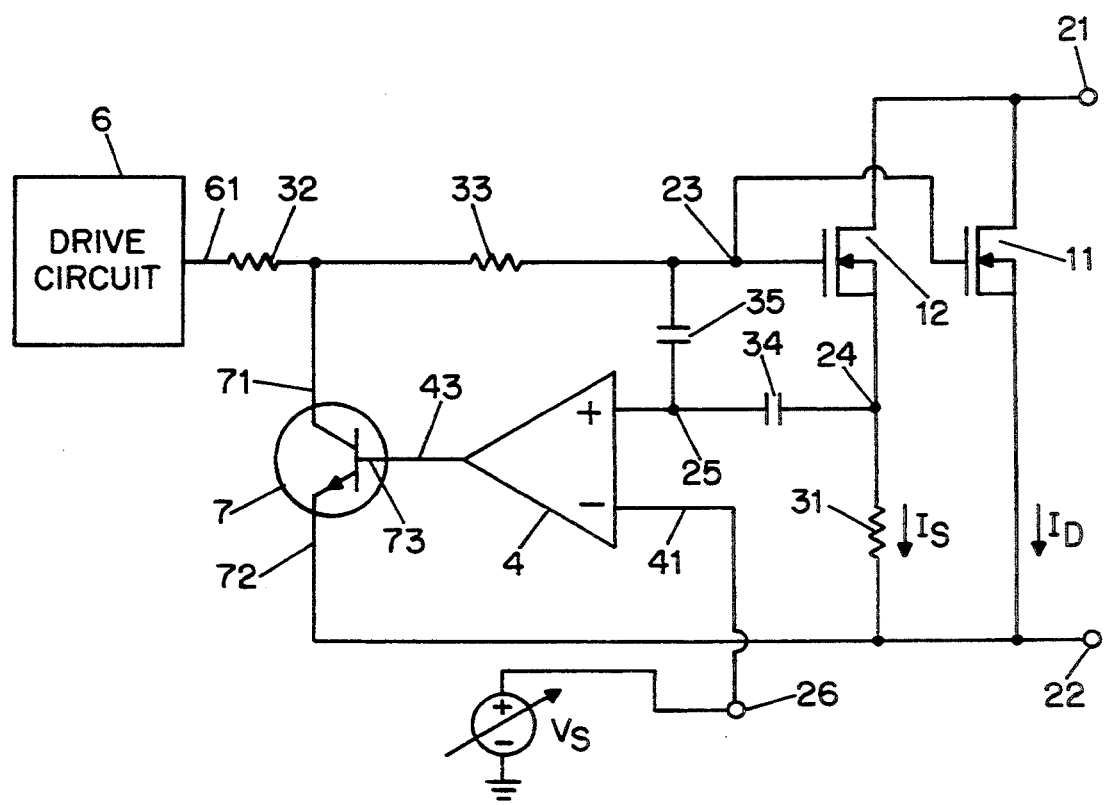
FIG. 33 is a circuit diagram of a current-limiting circuit according to a preferred twenty-ninth embodiment of the present invention.
Figure 34:
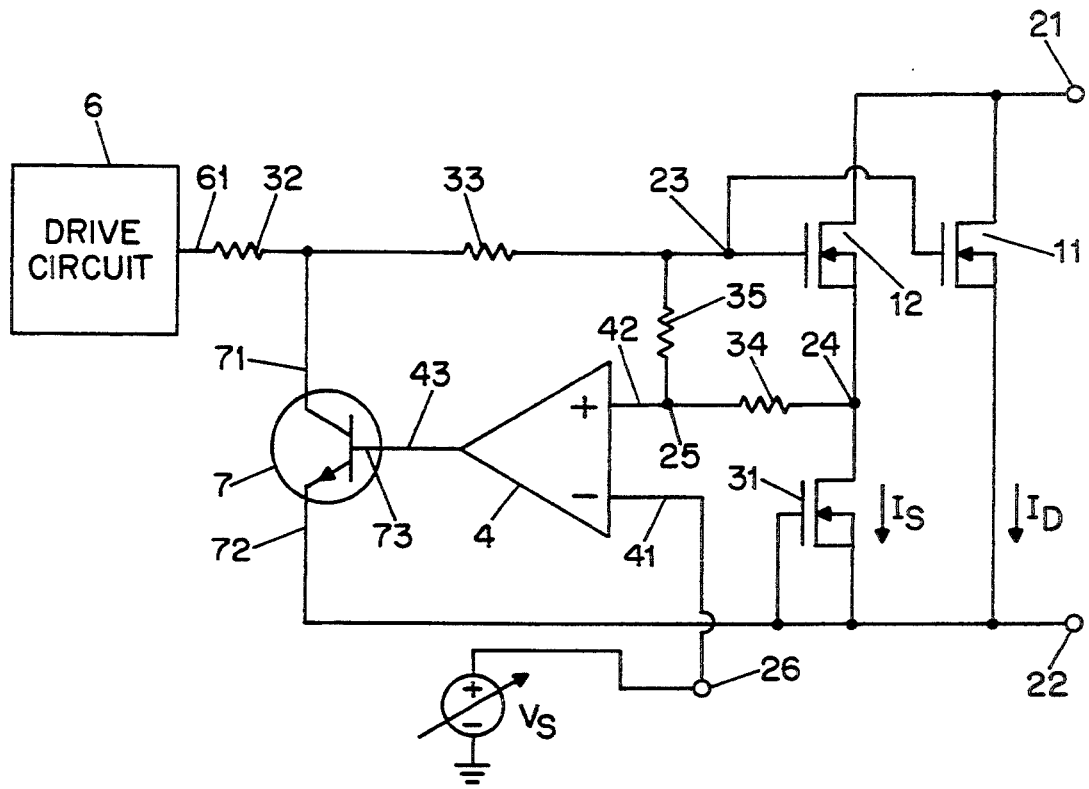
FIG. 34 is a circuit diagram of a current-limiting circuit according to a preferred thirtieth embodiment of the present invention.
Figure 35:
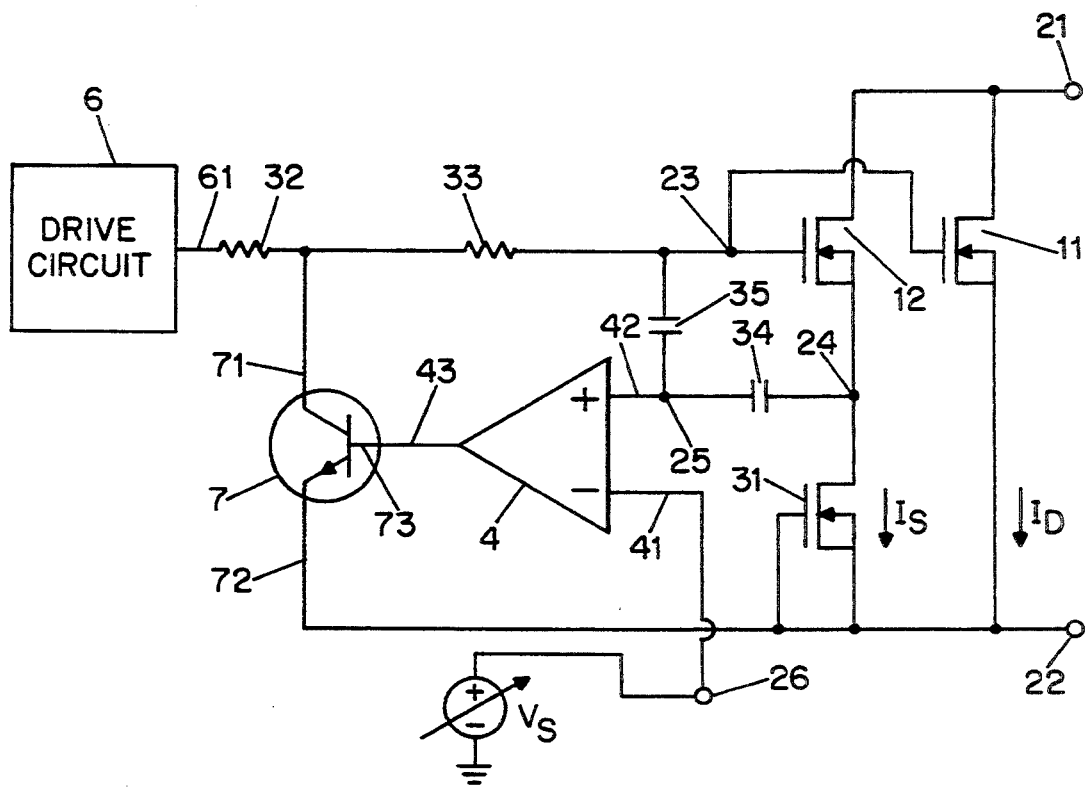
FIG. 35 is a circuit diagram of a current-limiting circuit according to a preferred thirty-first embodiment of the present invention.
Figure 36:
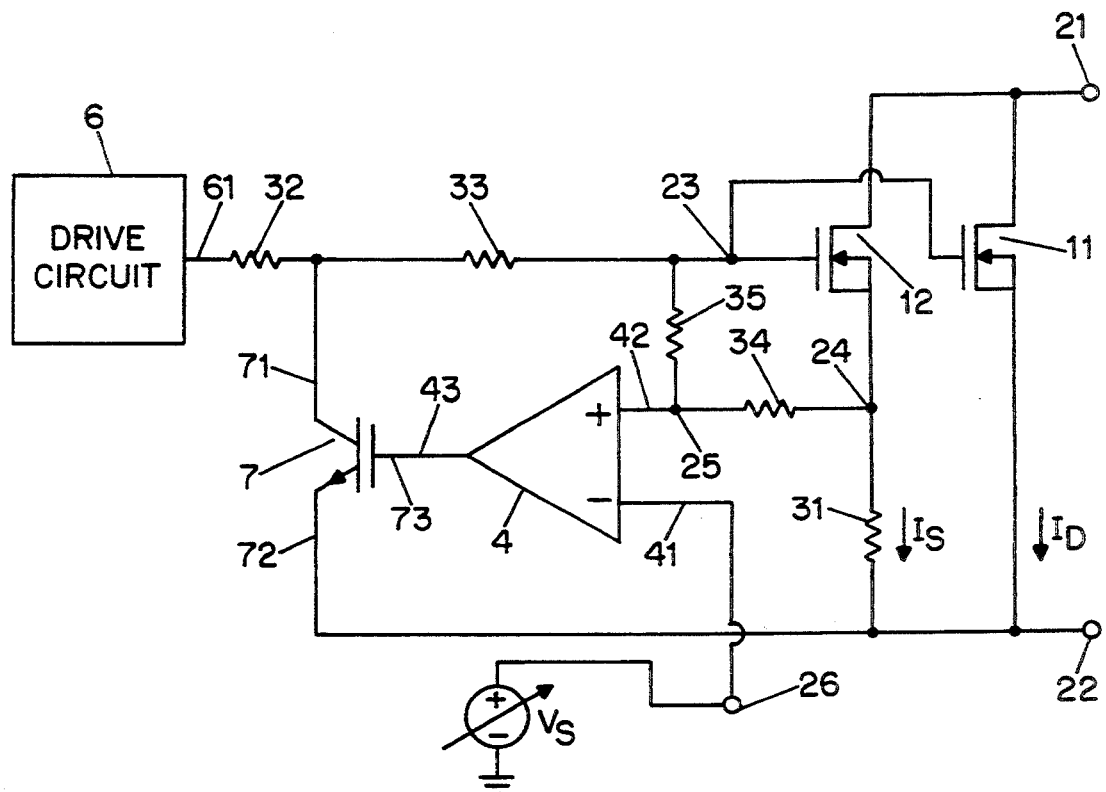
FIG. 36 is a circuit diagram of a current-limiting circuit according to a preferred thirty-second embodiment of the present invention.
Figure 37:
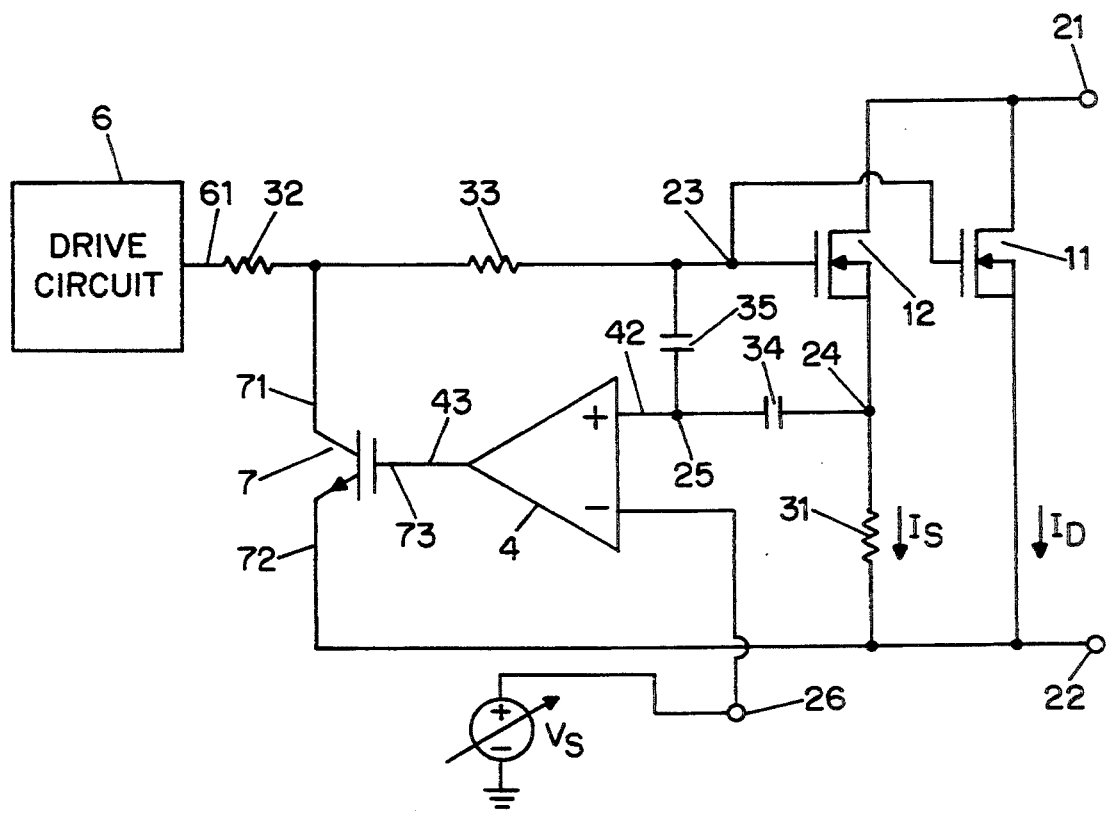
FIG. 37 is a circuit diagram of a current-limiting circuit according to a preferred thirty-third embodiment of the present invention.
Figure 38:
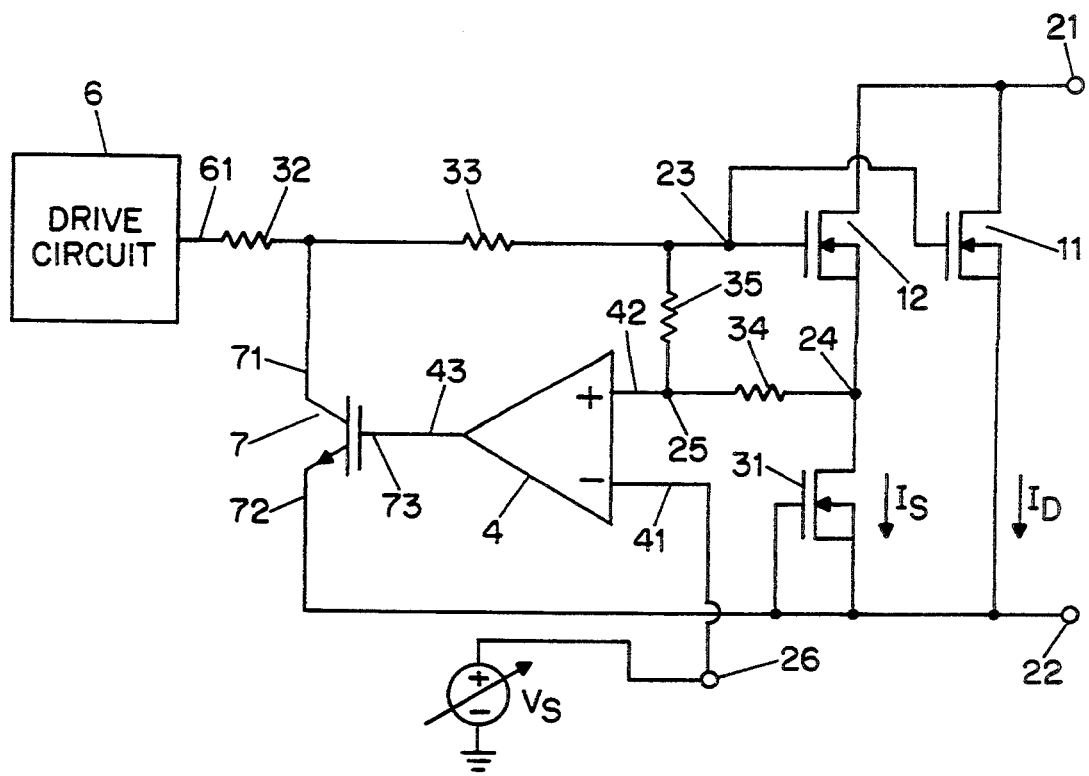
FIG. 38 is a circuit diagram of a current-limiting circuit according to a preferred thirty-fourth embodiment of the present invention.
Figure 39:
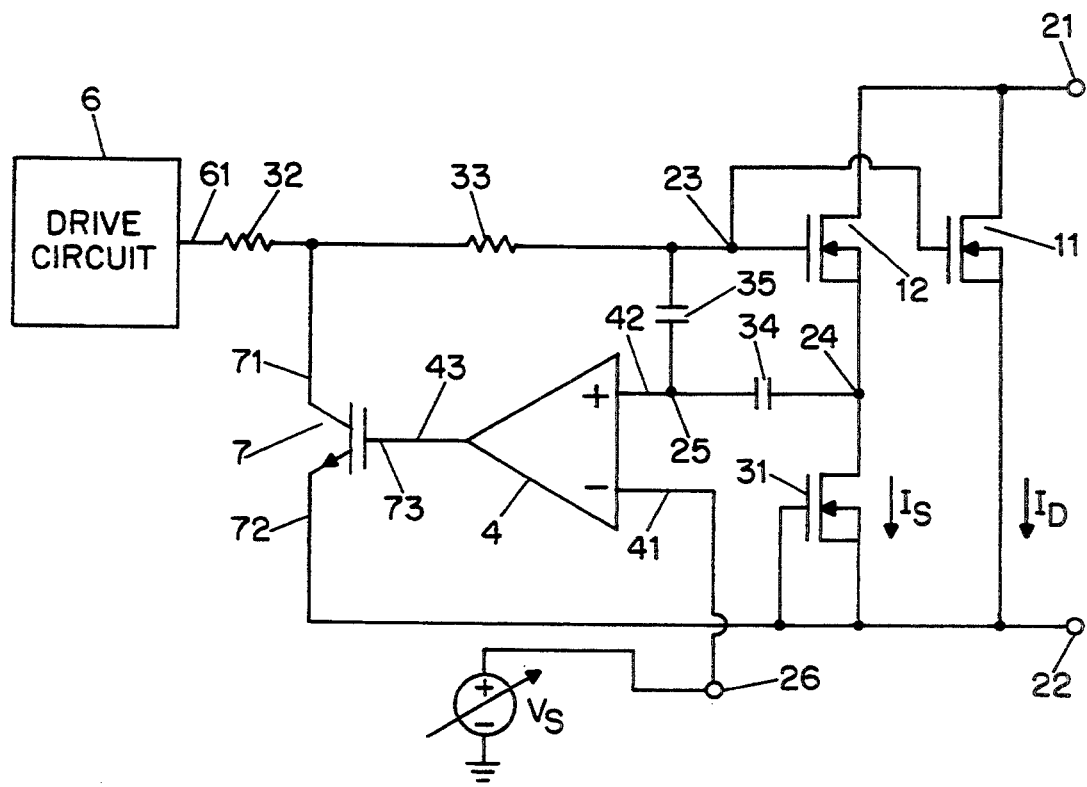
FIG. 39 is a circuit diagram of a current-limiting circuit according to a preferred thirty-fifth embodiment of the present invention.

FIGS. 7 and 8 show embodiments of a low-cost constant-voltage source which can be used even if the power source voltage is low for a current-limiting circuit. In these two constant-voltage sources, a depletion-type, N-channel MOSFET 8, having a source terminal 82 and a gate terminal 83 connected to a common output terminal 50, and an enhancement-type, N-channel MOSFET 9, having a drain terminal 91 and a gate terminal 93 connected to the common output terminal 50, are connected in series between a power source terminal $V_{CC}$ and a ground terminal GND.

FIG. 7 gives an example in which the constant voltage $V_{REF}$ is generated by using the ground as a reference, while FIG. 8 gives an example in which the constant voltage $V_{REF}$ is generated using the power source voltage as a reference. In either case, the MOSFETs 8 and 9 are N-channel type MOSFETs, although a P-channel MOSFET may be used.

Figure 2:
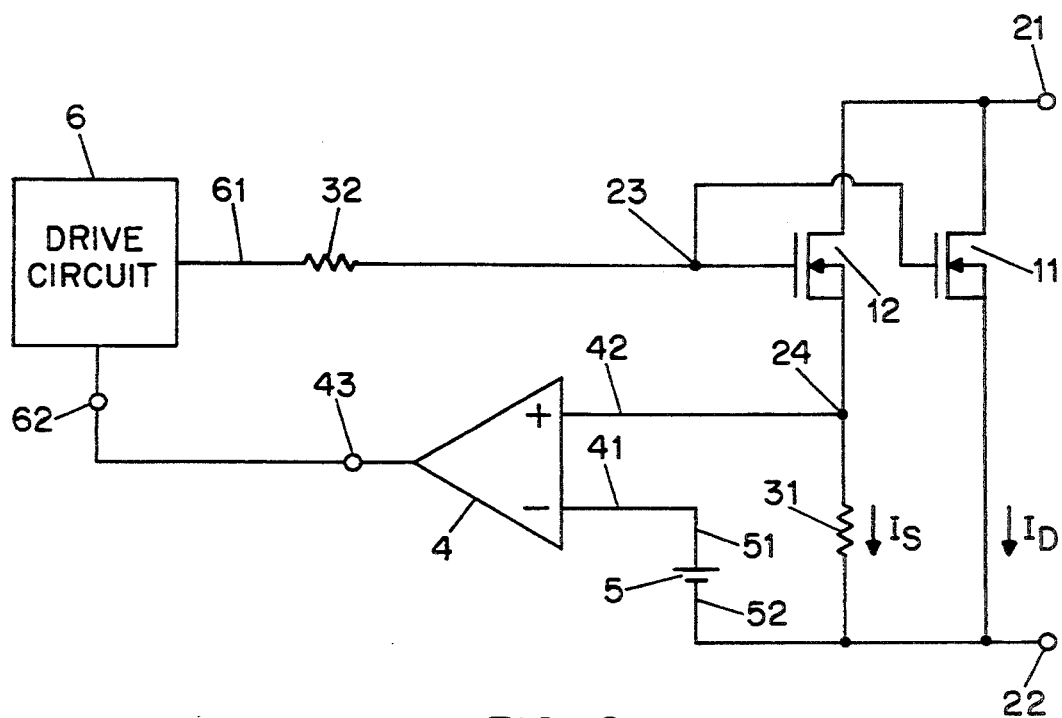
FIG. 2 is a circuit diagram of a conventional current-limiting circuit.

The constant voltage sources shown in FIGS. 7 and 8 are cost efficient because they consist of only two MOSFETs, and can be used not only as the constant voltage source 5 for the embodiments shown in FIGS. 1 and 4, but also as the constant voltage source for an overcurrent protective circuit and other current-limiting circuits as shown in FIG. 2, for example. The elements in each of the above embodiments, including the constant voltage source, can be integrated into a single-chip power IC.

The foregoing embodiments merely illustrate the principles of the invention, and those skilled in the art will be able to devise numerous arrangements which, although not explicitly shown or described herein, embody the principles of the invention. For example, while the foregoing embodiments incorporate the MOSFET 11 as the power semiconductor element, any power semiconductor element may be used, including an IGBT or a power bipolar transistor. Moreover, such an element may be either of an N-channel or P-channel type. However, if the circuits shown in FIGS. 4 and 6 were to incorporate a bipolar transistor, an operational amplifier 4 with a high current-drive capacity should be used so that a sufficient base current can be supplied.

Alternative embodiments of the present invention incorporating the above-described alternative components in place of the current-detection resistor 31, the gain adjusting resistors 34 and 35, and the MOSFET 7 used as the gate control transistor are shown in FIGS. 9–39. FIGS. 9–39 represent fifth through thirty-fifth alternative embodiments of the present invention, respectively.

I claim:

1. A current-limiting circuit comprising:
   a main semiconductor element having a first main terminal, a second main terminal and a control terminal, through said main semiconductor element flowing a current presenting an output current of the current-limiting circuit;
   a current-mirror element having a first main terminal and a control terminal in common with the first main terminal and the control terminal of the main semiconductor element, respectively, and having a second main terminal, through said current-mirror element flowing a current with a predetermined ratio to said output current;
   an operational amplifier having a first input terminal connected to the current-mirror element, a second input terminal connected to a reference voltage input terminal, and an output terminal connected to the control terminal of the current-mirror element, said operational amplifier producing an output signal for suppressing said output current when an input voltage to said first input terminal exceeds an input voltage to said second input terminal;
   a first gain adjusting element connected between the first input terminal of the operational amplifier and the second main terminal of the current-mirror element, said first gain adjusting element having a first selected impedance value;
   a second gain adjusting element connected between the first input terminal of the operational amplifier and the control terminal of the current-mirror element, said second gain adjusting element having a second selected impedance value, said second selected impedance value being a predetermined magnification of said first selected impedance value for a stable operation of said operational amplifier;
   a current detection element connected between the second main terminal of the current-mirror element and the second main terminal of the main semiconductor element, a voltage proportional to the output current being produced across said current detection element; and
   a reference voltage source connected to the reference voltage input terminal.

2. The current-limiting circuit as claimed in claim 1, further comprising a resistance element connected between the output terminal of the operational amplifier and the control terminal of the main semiconductor element, said resistance element limiting operating speeds of the main semiconductor element.

3. The current-limiting circuit according to claim 2, wherein the reference voltage source provides a variable voltage.

4. The current-limiting circuit according to claim 3, wherein the current detection element is a resistor.

5. The current-limiting circuit according to claim 3, wherein the current detection element is a MOSFET.

6. The current-limiting circuit according to claim 4 or claim 5, wherein the gain adjusting element is a resistor.

7. The current-limiting circuit according to claim 4 or claim 5, wherein the gain adjusting element is a capacitor.

8. The current-limiting circuit as claimed in claim 2, wherein the reference voltage source provides a constant voltage.

9. A current-limiting circuit as claimed in claim 8, wherein the current-detection element is a resistor.

10. A current-limiting circuit as claimed in claim 9, wherein the gain adjusting element is a resistor.

11. A current-limiting circuit as claimed in claim 9, wherein the gain adjusting element is a capacitor.

12. A current-limiting circuit as claimed in claim 8, wherein the current-detection element is a MOSFET.

13. A current-limiting circuit as claimed in claim 12, wherein the gain adjusting element is a resistor.

14. A current-limiting circuit as claimed in claim 12, wherein the gain adjusting element is a capacitor.

15. A current-limiting circuit as claimed in claim 1, further comprising:
   a drive circuit having a main terminal which is connected to the control terminal of the main semiconductor element; and
   a switching element connected between the output terminal of the operational amplifier and the drive circuit.

16. A current-limiting circuit as claimed in claim 15, further comprising a resistance element located between the switching element and the control terminal of the main semiconductor element, said resistance element limiting operating speeds of the main semiconductor element.

17. The current-limiting circuit according to claim 16, wherein the reference voltage source provides a variable voltage.

18. The current-limiting circuit according to claim 17, wherein the current detection element is a resistor.

19. The current-limiting-circuit according to claim 18, wherein the gain adjusting element is a resistor.

20. The current-limiting circuit according to claim 18, wherein the gain adjusting element is a capacitor.

21. The current-limiting circuit according to claim 19 or claim 20, wherein the switching element connected to the output terminal of the operational amplifier is a MOSFET.

22. The current-limiting circuit according to claim 19 or claim 20, wherein the switching element connected to the output terminal of the operational amplifier is a bipolar transistor.

23. The current-limiting circuit according to claim 19 or claim 20, wherein the switching element connected to the output terminal of the operational amplifier is an insulated gate bipolar transistor.

24. The current-limiting circuit according to claim 17, wherein the current detection element is a MOSFET.

25. The current-limiting-circuit according to claim 24, wherein the gain adjusting element is a resistor.

26. The current-limiting circuit according to claim 24, wherein the gain adjusting element is a capacitor.

27. The current-limiting circuit according to claim 25 or claim 26, wherein the switching element connected to the output terminal of the operational amplifier is a MOSFET.

28. The current-limiting circuit according to claim 25 or claim 26, wherein the switching element connected to the output terminal of the operational amplifier is a bipolar transistor.

29. The current-limiting circuit according to claim 25 or claim 26, wherein the switching element connected to the output terminal of the operational amplifier is an insulated gate bipolar transistor.

30. The current-limiting circuit as claimed in claim 16, wherein the reference voltage source provides a constant voltage.

31. A current-limiting circuit as claimed in claim 30, wherein the current-detection element is a MOSFET.

32. A current-limiting circuit as claimed in claim 31, wherein the gain adjusting element is a resistor.

33. A current-limiting circuit as claimed in claim 32, wherein the switching element connected to the output terminal of the operational amplifier is a MOSFET.

34. A current-limiting circuit as claimed in claim 32, wherein the switching element connected to the output terminal of the operational amplifier is a bipolar transistor.

35. A current-limiting circuit as claimed in claim 32, wherein the switching element connected to the output terminal of the operational amplifier is an insulated gate bipolar transistor.

36. A current-limiting circuit as claimed in claim 31, wherein the gain adjusting element is a capacitor.

37. A current-limiting circuit as claimed in claim 36, wherein the switching element connected to the output terminal of the operational amplifier is a MOSFET.

38. A current-limiting circuit as claimed in claim 36, wherein the switching element connected to the output terminal of the operational amplifier is a bipolar transistor.

39. A current-limiting circuit as claimed in claim 36, wherein the switching element connected to the output terminal of the operational amplifier is an insulated gate bipolar transistor.

40. The current-limiting circuit according to claim 8 or claim 30, wherein the voltage source comprises:
a depletion-type MOSFET having a gate terminal and a source terminal, both of which terminals are connected to a common output terminal, and a drain terminal connected to a high voltage side of a power source; and
an enhancement-type MOSFET connected in series to said depletion-type MOSFET, said enhancement-type MOSFET having a gate terminal and a drain terminal connected to the common output terminal, and a source terminal connected to a low voltage side of the power source, said enhancement-type MOSFET providing a constant voltage between the common output terminal and the source terminal.

41. The current-limiting circuit according to claim 8 or claim 30, wherein the constant-voltage source comprises:
a depletion-type MOSFET having a gate terminal and a source terminal, both of which terminals are connected to a low voltage side of a power source, and a drain terminal connected to a common output terminal; and
an enhancement-type MOSFET connected in series to said depletion-type MOSFET, said enhancement-type MOSFET having a gate terminal and a drain terminal connected to a high voltage side of the power source, and a source terminal connected to the common output terminal, said enhancement-type MOSFET providing a constant voltage between the common output terminal and the drain terminal.

42. A current-limiting circuit as claimed in claim 30, wherein the current-detection element is a resistor.

43. A current-limiting circuit as claimed in claim 42, wherein the gain adjusting element is a capacitor.

44. A current-limiting circuit as claimed in claim 43, wherein the switching element connected to the output terminal of the operational amplifier is a MOSFET.

45. A current-limiting circuit as claimed in claim 43, wherein the switching element connected to the output terminal of the operational amplifier is a bipolar transistor.

46. A current-limiting circuit as claimed in claim 43, wherein the switching element connected to the output terminal of the operational amplifier is an insulated gate bipolar transistor.

47. A current-limiting circuit as claimed in claim 42, wherein the gain adjusting element is a resistor.

48. A current-limiting circuit as claimed in claim 47, wherein the switching element connected to the output terminal of the operational amplifier is a MOSFET.

49. A current-limiting circuit as claimed in claim 47 wherein the switching element connected to the output terminal of the operational amplifier is a bipolar transistor.

50. A current-limiting circuit as claimed in claim 47, wherein the switching element connected to the output terminal of the operational amplifier is an insulated gate bipolar transistor.

* * * * *

UNITED STATES PATENT AND TRADEMARK OFFICE
CERTIFICATE OF CORRECTION

PATENT NO. : 5,422,593
DATED : June 6, 1995
INVENTOR(S) : Tatsuhiko Fujihira

It is certified that error appears in the above-indentified patent and that said Letters Patent is hereby corrected as shown below:

Column 9, between lines 14 and 15, add new paragraph
--Alternative to the current-detection resistor 31, other elements, for example a MOSFET, can be used as a current-detection element as long as the chosen element generates a voltage change that is linearly proportional to the current. Similarly, while gain adjusting resistors 34 and 35 offer advantages in ease of integration and low cost, other elements, for example a capacitor, can be used alternatively as a gain adjusting element as long as it has an impedance. Furthermore, the MOSFET 7 used as the gate control transistor in the circuits shown in Figs. 1 and 5 may be replaced by other transistors including a bipolar transistor or an IGBT.--;

Column 9, line 28, "presenting" should read --representing--.

Signed and Sealed this

Second Day of April, 1996

Attest:

BRUCE LEHMAN

Attesting Officer      Commissioner of Patents and Trademarks